(12) United States Patent
Hieda et al.

(10) Patent No.: US 6,278,152 B1
(45) Date of Patent: Aug. 21, 2001

(54) SEMICONDUCTOR DEVICE AND METHOD OF MANUFACTURING THE SAME

(75) Inventors: Katsuhiko Hieda, Yokohama; Kazuhiro Eguchi, Chigasaki, both of (JP); Keitaro Imai, Wappingers Falls, NY (US); Tomonori Aoyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/105,030

(22) Filed: Jun. 25, 1998

(30) Foreign Application Priority Data

Jun. 27, 1997 (JP) .................................................. 9-171700
Nov. 28, 1997 (JP) .................................................. 9-344438

(51) Int. Cl.$^7$ ...................................................... H01L 29/00
(52) U.S. Cl. ........................................... 257/306; 257/532
(58) Field of Search .................................... 257/306, 532, 257/310

(56) References Cited

U.S. PATENT DOCUMENTS 5,907,772 * 5/1999 Iwasaki ................................. 438/253
6,002,575 * 12/1999 Kotechi et al. ....................... 257/306
6,023,083 * 2/2000 Tomita ................................. 257/306

OTHER PUBLICATIONS

Yamamichi et al.; "An ECR MOCVD (Ba,Sr) TiO$_3$ Based Stacked Capacitor Technology With RuO$_2$/RuTiN/TiSi$_x$ Storage Nodes For Gbit–scale DRAMs", IEDM Technical Digest, Dec. 1995, pp. 119–122.

* cited by examiner

Primary Examiner—Mark V. Prenty
(74) Attorney, Agent, or Firm—Finnegan, Henderson, Farabow, Garrett & Dunner, L.L.P.

(57) ABSTRACT

A semiconductor device comprises a first lower capacitor electrode composed of a first conductive film, a second lower capacitor electrode composed of a second conductive film which covers at least the side face of the first lower capacitor electrode at its top face, a capacitor insulating film provided on the second lower capacitor electrode, and an upper capacitor electrode provided on the capacitor insulating film, wherein film stress in the first conductive film is lower than that in the second conductive film and the volume of the first conductive film is larger than that of the second conductive film. The above-described structure reduces leakage current in the capacitor.

13 Claims, 20 Drawing Sheets

SEMICONDUCTOR DEVICE AND METHOD OF MANUFACTURING THE SAME

BACKGROUND OF THE INVENTION

The present invention relates to a semiconductor device and a method of manufacturing the semiconductor device, and more particularly a semiconductor device featuring the electrode structure of a capacitor and a method of manufacturing the semiconductor device.

In recent years, large-scale integrated circuits (LSIS) have been widely used in the important sections of computers and communication equipment. The performance of the entire equipment is closely related to the performance of each LSI.

Especially in such semiconductor memory devices as DRAMs, as the minimum process dimension decreases, the area of a single memory cell become increasingly small. This makes the capacitor area in a memory cell much smaller.

The smaller memory cell makes the capacitance of the capacitor (storage capacitance: Cs) smaller. The capacitance cannot be made very small because of the sensitivity and errors in software. Namely, as the memory cell area becomes smaller, it is more difficult to secure the necessary capacitance of the capacitor.

To solve this problem, the following two methods have been studied. One method is to form a capacitor three-dimensionally to make the capacitor surface area as large as possible with a smaller cell area, thereby securing the capacitance of the capacitor. The other method is to use an insulating film with high permittivity (what is called a high $\epsilon$ film) for a capacitor insulating film.

With the coming generation of design rules of the order of 0.15 microns (or the coming generation of 1-Gbit DRAMs), the process of manufacturing complex three-dimensional storage nodes would become more difficult.

Consequently, as for a method of gaining the capacitance of the capacitor, a method of using an insulating film with higher permittivity (a high-permittivity insulating film) than that of an oxide film for the capacitor insulating film is very important. Typical high-permittivity insulating films include a (Ba, Sr)TiO$_3$ film.

In the case of a (Ba, Sr)TiO$_3$ film, use of an RU film that presents the conductivity of metal even when oxidized in the course of processing or a stacked film of an RuO$_2$ film/Ru film has been studied (refer to S. Yamamichi, et al., IEDM Technical Digest, pp. 119–122, 1995).

FIG. 1 shows a sectional view of a conventional stacked DRAM memory cell using a stacked film of an RuO$_2$ film/Ru film as a storage node.

Explanation will be given according to the manufacturing processes. First, an element isolating insulating film 82 is formed on a p-type silicon substrate 81.

Next, after a gate insulating film 83, a gate electrode (word line) 84, a gate cap layer 85, and a low-impurity-concentration n-type source/drain diffused layer 86 have been formed, interlayer insulating films 87, 88 are deposited and the surface is flattened.

Then, after polycrystalline silicon films 89, 90 have been formed in a storage node contact area and a bit line contact area in such a manner that they are embedded in the areas, a bit line 91 is formed.

Then, after an interlayer insulating film 92 has been deposited and its surface has been flattened, a storage node contact hole is made. In the hole, a high-impurity-concentration polycrystalline silicon film 93 is embedded.

Next, after a TiSi$_x$ (titanium silicide) film 94, aTiN film 95, an Ru film 96, and an RuO$_2$ film 97 have been formed in that order, this stacked film is patterned by ordinary lithography using photoresist (not shown) and RIE techniques to form a storage node 98. Thereafter, the photoresist is peeled.

Finally, a capacitor insulating film 99 and a plate electrode (e.g., a single layer film of an Ru film or a stacked film of an Ru film/TiN film) 100 which are composed of a high-permittivity insulating film, such as a (Ba, Sr)TiO$_3$ film, are formed in that order on the entire surface in such a manner that they cover the side face and top face of the storage node 98.

The stacked DRAM using this type of storage node 98, however, has the following problem.

Firstly, because the RuO$_2$ film 97 with a higher film stress than that in the Ru film 96 occupies most of the storage node 98, the film stress in the storage node 98 becomes higher, resulting in an increase in the leakage current in the capacitor insulating film 99 causes by the film stress.

Secondly, because the TiSi$_x$ film 94, TiN. film 95, Ru film 96, and RuO$_2$ film 97 have appeared on the side face of the storage node 98, this increases leakage current in the capacitor insulating film 99. The reason for this is that the interface between the TiSi$_x$ film 94 and the TiN film 95, the interface between the TiN film 95 and the Ru film 96, and the interface between the Ru film 96 and the RuO$_2$ film 97 act as paths for leakage currents.

Lastly, because the corners of the top (RuO$_2$ film 97) of the storage node 98 have an acute angle of about 90° and electric fields are liable to concentrate there, this increases leakage current in the capacitor insulating film 99.

BRIEF SUMMARY OF THE INVENTION

A first object of the present invention is to provide a semiconductor device with a capacitor capable of reducing leakage current and a method of manufacturing the semiconductor device.

A second object of the present invention is to provide a semiconductor device with an electrode which is composed of Ru, the oxide of Ru, or both of these and whose surface area is easily made larger and a method of manufacturing the semiconductor device.

According to a first aspect of the present invention which achieves the first object, there is provided a semiconductor device comprising: a first lower capacitor electrode formed of a first conductive film and having a top face and side face; a second lower capacitor electrode formed of a second conductive film covering at least an upper portion of the side face of the first lower capacitor electrode; a capacitor insulating film provided on the second lower capacitor electrode; and an upper capacitor electrode provided on the capacitor insulating film, wherein film stress of the first conductive film is lower than that of the second conductive film and a volume of the first conductive film is larger than that of the second conductive film.

It is desirable that the second conductive film forming the second lower capacitor electrode further covers the top face of the first conductive film.

With such a structure, even when a material whose film stress is high is used as the second lower capacitor electrode, the film stress in the lower capacitor electrode is low on the whole. As a result, the increase of leakage current in the capacitor insulating film resulting from the film stress in the lower capacitor electrode is suppressed, helping reduce leakage current.

It is desirable that the first conductive film is a Ta film and the second conductive film is an Ru film.

With this structure, an Ru film can be used which presents high film stress as the second lower capacitor electrode but has the property of presenting conductivity even after oxidation, which is favorable in terms of processing.

It is desirable that the capacitor insulating film is a high-permittivity insulating film.

It is desirable that the capacitor insulating film is a high-permittivity dielectric film containing Ba, Sr, and Ti.

With such a structure, leakage current can be reduced and the necessary capacitance of a capacitor can be secured easily even in further miniaturization.

It is desirable that a lower portion of the side face of the first lower capacitor electrode is covered with an insulating film.

With such a structure, because there is no capacitor insulating film at the corners of the undersurface of the first lower capacitor electrode, the concentration of electric fields at the corners of the undersurface of the first lower capacitor electrode is less liable to produce leakage current in the capacitor insulating film. Therefore, it is possible to reduce leakage current in the capacitor insulating film more effectively.

The second lower capacitor electrode at an edge of the top face of the first lower capacitor electrode is rounded.

With such a structure, the concentration of electric fields at the corners of the top face of the first lower capacitor electrode is alleviated. As a result, it is possible to reduce leakage current in the capacitor insulating film more effectively.

The first and the second lower capacitor electrode can be a storage node of a capacitor in a stacked DRAM.

With such a structure, it is possible to reduce leakage current in the capacitor caused by the storage nodes of the capacitor in the stacked DRAM.

In this case, preferably, for example, a Ta film is used as the first conductive film, an Ru film as the second conductive film, and a $(Ba, Sr)TiO_3$ film as the capacitor insulating film.

Use of such a film structure realizes a low-leakage-current, large-capacitance, process-oriented capacitor, which helps realize far higher-integration stacked DRAMs.

According to a second aspect of the present invention, there is provided a method of manufacturing semiconductor devices, comprising the steps of: forming on a semiconductor substrate a first conductive film to become a first lower capacitor electrode; forming on the first conducive film a second conductive film which is thinner than the first conductive film and whose film stress is higher than that of the first conductive film and which is a part of a second lower capacitor electrode that has a smaller volume than that of the first lower capacitor electrode; forming the first lower capacitor electrode and the part of the second lower capacitor electrode on the first lower capacitor electrode by patterning the first and the second conductive film; depositing a third conductive film whose constituent material is the same as that of the second conductive film and which is to become a remaining part of the second lower capacitor electrode in such a manner that the third conductive film covers the first lower capacitor electrode and the part of the second lower capacitor electrode; completing the second lower capacitor electrode whose volume is smaller than that of the first lower capacitor electrode by anisotropically etching an entire surface of the third conductive film and selectively leaving the third conductive film on a side face of the first lower capacitor electrode and on a side face of the part of the second lower capacitor electrode to form the remaining part of the second lower capacitor electrode; and forming a capacitor insulating film and an upper capacitor electrode on the second lower capacitor electrode in that order.

With this structure, a capacitor where all of the side face of the first lower capacitor electrode is covered with the second lower capacitor electrode in the semiconductor of the first aspect can be manufactured.

With the method, because the remaining portion of the second lower capacitor electrode (the second lower capacitor electrode provided on the sidewalls of the first lower capacitor electrode) is formed by what is called sidewall formation, the area (plane area) of the second lower capacitor electrode viewed from above is larger than that determined by the minimum design rule for lithography.

Accordingly, in a case where capacitors are formed by such a method, even when the distance between the first lower capacitor electrodes is the minimum line width F, the plane area of the second lower capacitor electrode is larger than that determined by the minimum design rule. That is, the distance between adjacent second lower capacitor electrodes is shorter than F, making the capacitance of the capacitor larger.

After the entire surface of the third conductive film is etched anisotropically, the third conductive film (the second lower capacitor electrode) on the corners of the top face of the first lower capacitor electrode retains the round shape at the time of deposition. As a result, the concentration of electric fields at the corners of the top face of the first lower capacitor electrode is alleviated, which helps reduce leakage current in the capacitor insulating film more effectively.

According to a third aspect of the present invention, there is provided a method of manufacturing semiconductor devices, comprising the steps of: forming a stacked insulating film composed of a first insulating film and a second insulating film which is on the first insulating film; etching the stacked insulating film to make a groove whose bottom portion is deeper than an interface between the first insulating film and the second insulating film; forming in the groove a first lower capacitor electrode formed of a first conductive film, a top face of the first lower capacitor electrode being higher than the interface and lower than a top surface of the second insulating film; embedding in the groove a second conductive film which is thinner than the first conductive film and whose film stress is higher than that of the first conductive film and which is a part of a second lower capacitor electrode that has a smaller volume than that of the first lower capacitor electrode; depositing a third conductive film whose constituent material is the same as that of the second conductive film and which is to become a remaining part of the second lower capacitor electrode in such a manner that the third conductive film covers the first lower capacitor electrode exposed after selective removal of the second insulating film and the part of the second lower capacitor electrode; completing the second lower capacitor electrode whose volume is smaller than that of the first lower capacitor electrode by anisotropically etching an entire surface of the third conductive film and selectively leaving the third conductive film on a side face of the exposed first lower capacitor electrode and on a side face of the part of the second lower capacitor electrode to form the remaining part of the second lower capacitor electrode; and forming a capacitor insulating film and an upper capacitor electrode on the second lower capacitor electrode in that order.

With such a manufacturing method, it is possible to manufacture a structure where the side face of the lower electrode is covered with an insulating film. The method of the third aspect produces the same effect as the method of manufacturing semiconductor devices of the second aspect.

According to a fourth aspect of the present invention, there is provided a semiconductor device comprising: a semiconductor substrate; an insulating member formed above the semiconductor substrate; and an electrode covering an entire surface of the insulating member, the electrode being composed of at least one conductive material of ruthenium, ruthenium oxide, and a compound of ruthenium and ruthenium oxide.

The electrode can be one closer to the semiconductor substrate of two capacitor electrodes constituting a capacitor.

It is desirable that the insulating member contains anyone of silicon oxide and silicon nitride.

The semiconductor device of the invention further comprises: an interlayer insulating film formed between the electrode and the semiconductor substrate, a contact plug formed so as to penetrate the interlayer insulating film and connecting the electrode to a conductive region formed on the semiconductor substrate; and a conductive film made of a material different from a constituent material of the electrode and provided between the electrode and the contact plug.

It is desirable that the conductive film is a silicon film containing impurities.

In that case, the conductive film may be surrounded by a silicon oxide film formed between a peripheral portion of the electrode and the interlayer insulating film.

At least a surface portion of the interlayer insulating film may be made of a silicon nitride film.

According to a fifth aspect of the present invention, there is provided a method of manufacturing semiconductor devices, comprising the steps of: forming on a semiconductor substrate a region including anyone of a silicon film and a silicon nitride film; forming on the region a first conductive film made of anyone of ruthenium, ruthenium oxide, and a compound of ruthenium and ruthenium oxide; forming a first insulating film on the first conductive film; etching the first conductive film and the first insulating film to form an insulating member whose undersurface is covered with the first conductive film; and selectively forming a second conductive film made of anyone of ruthenium, ruthenium oxide, and a compound of ruthenium and ruthenium oxide on a side face of the first conductive film and on an exposed surface of the insulating member.

The method of manufacturing semiconductor devices of the invention further comprises a step of forming a third conductive film on the second conductive film with a second insulating film interposed therebetween, wherein a capacitor is formed by using the second conductive film as a first capacitor electrode, the second insulating film as a capacitor insulating film, and the third conductive film as a second capacitor electrode.

In the method, the region may include a silicon film, and the method may further comprise the steps of removing the silicon film outside a region covered with the first and the second conductive film, after the step of selectively forming the second conductive film, and selectively oxidizing a periphery of a remaining portion of the silicon film.

In the present invention, to selectively form the second conductive film, it is desirable that an insulating film to become the insulating member should be a silicon oxide film or a silicon nitride film.

To selectively form the second conductive film, it is desirable that, for example, the region should include a silicon nitride film and an insulating film to become the insulating member be a silicon oxide film.

It is desirable that the step of selectively forming the second conductive film should be performed by selective CVD techniques using ruthenium methallothene gas or its derivative gas and oxidizing gas. In this case, it is preferable to set the substrate temperature in the range from 150° C. to 450° C.

The reason why the substrate temperature should be at 150° C. or above is to secure a sufficient film formation rate. The reason why the substrate temperature should be at 450° C. or below is to secure a sufficient selective growth.

The oxidizing gas is a gas including, such as oxygen, ozone, or oxygen radical.

With the electrode constructed as explained in the fourth aspect of the invention, when the insulating member is formed large to make the surface area large, the surface area of the electrode will be larger even if a conductive film of the Ru family (a ruthenium film, a ruthenium oxide film, and a compound film of ruthenium and ruthenium oxide films) is made thin. The conductive film of the Ru family will not peel off after it has been formed if it is thin. Accordingly, with the present invention, it is easy to increase the surface area of the electrode that uses a conductive film of the Ru family.

The inventors' study has shown that conductive films of the Ru family was able to be selectively formed as follows: a conductive film of the Ru family was formed only on a silicon oxide film and a conductive film of the Ru family instead of forming a conductive film of the Ru family on a silicon film; a conductive film of the Ru family was formed only on a silicon nitride film and a conductive film of the Ru family instead of forming a conductive film of the Ru family on a silicon film; or a conductive film of the Ru family was formed only on a silicon oxide film and a conductive film of the Ru family instead of forming a conductive film of the Ru family on a silicon nitride film.

The manufacturing method according to the fifth aspect of the present invention makes use of such selective film formation of a conductive film of the Ru family. Specifically, the second conductive film is formed by such selective film formation. This eliminates the need of removing the unnecessary second conductive film after the formation of the second conductive film, which makes it possible to form electrodes of the invention without increasing the number of processes.

Furthermore, when the periphery of the silicon film is oxidized, the silicon film is isolated from the capacitor insulating film by the silicon oxide film. This prevents the characteristic from deteriorating due to the mutual diffusion between the silicon film and the capacitor insulating film in the heat treatment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Hereinafter, referring to the accompanying drawings, embodiments of the present invention will be explained.

(First Embodiment)

Figure 2:
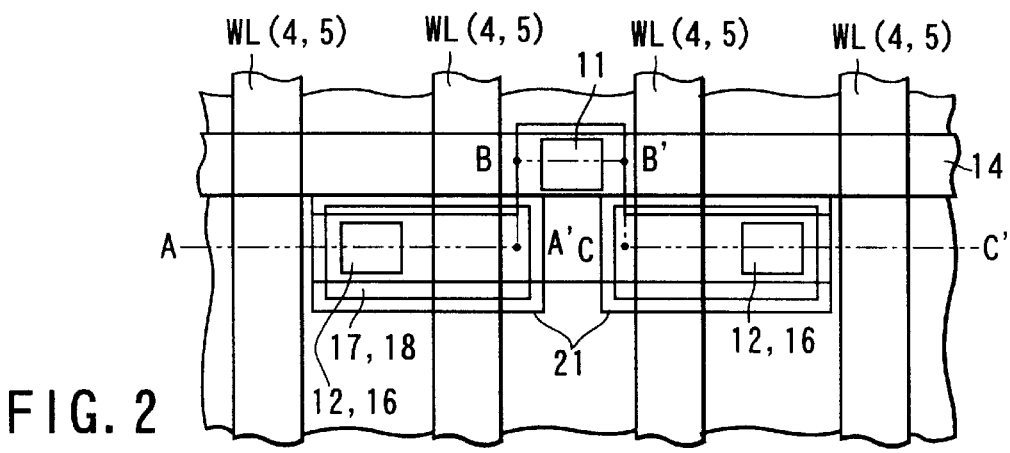
FIG. 2 is a schematic plan view of a stacked DRAM memory cell according to a first embodiment of the present invention.
Figure 3:
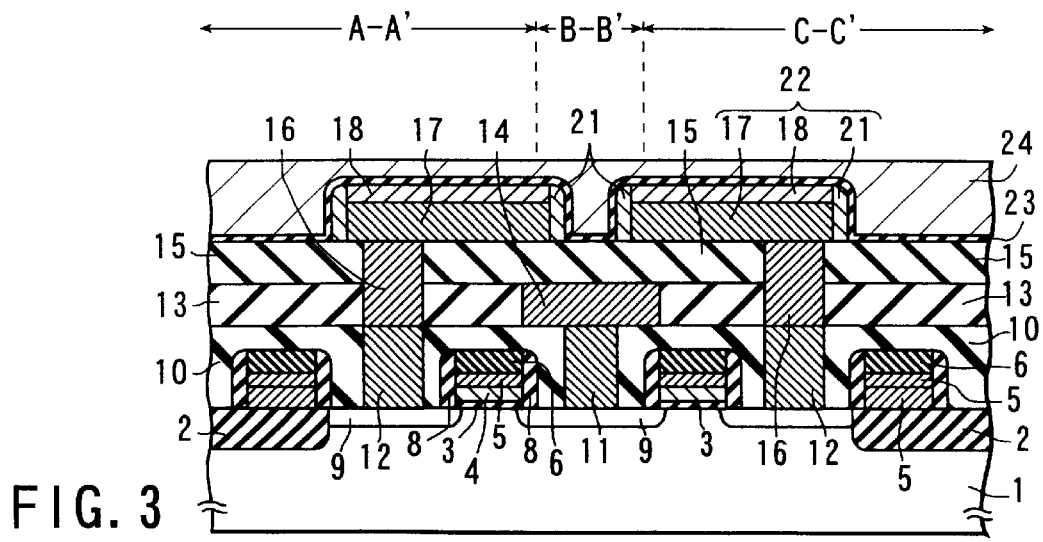
FIG. 3 is a sectional view taken continuously along line A–A', line B–B', and line C–C' of FIG. 2.

FIG. 2 is a schematic plan view of a stacked DRAM memory cell according to a first embodiment of the present invention. FIG. 3 is a sectional view of the memory cell of FIG. 2 taken continuously along line A–A', line B–B', and line C–C'.

Figure 1:
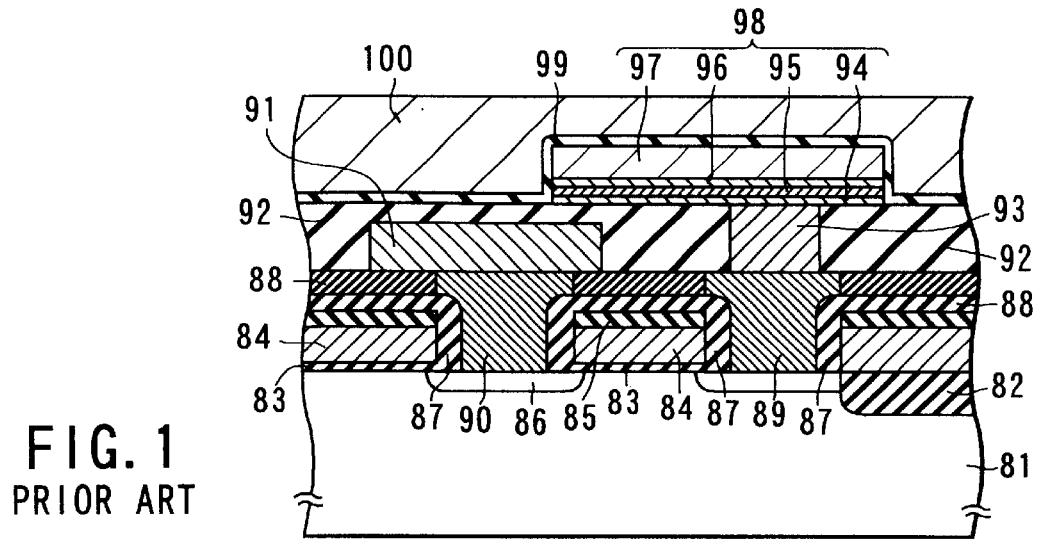
FIG. 1 is a sectional view of a conventional stacked DRAM memory cell.

The stacked DRAM of the embodiment basically has the same structure as that of the conventional stacked DRAM of FIG. 1 except for the structure of the storage node. The difference between the staked DRAM of the embodiment and the conventional stacked DRAM of FIG. 1 is as follows.

A storage node 22 is composed of a Ta film 17 (a first lower capacitor electrode) and Ru films 18, 21 (second lower capacitor electrodes) covering the top and side faces of the Ta film. The Ta film 17 whose film stress is lower than that in the Ru films 18, 21 occupies most of the storage node 22.

With such a structure, even when the Ru films 18, 21, which have the property of having high film stress and presenting conductivity even after being oxidized, are used, the film stress in the entire storage node is low. The property is preferable in terms of processing. The low film stress makes it possible to suppress leakage current in the capacitor insulating film 23 resulting from the film stress, helping reduce the leakage current.

The formation of the Ru films 18, 21 on the Ta film 17 improves the orientation of the Ru films 18, 21, resulting in the denser Ru films 18, 21. Specifically, they are oriented highly towards the (200) direction. This enables heat processing after the formation of Ru films 18, 21. For instance, it is possible to suppress the surface roughness of the Ru films due to a rise in temperature at the time of forming the capacitor insulating film 23. This suppresses leakage current resulting from the surface roughness, helping decrease the leakage current.

In a manufacturing method explained later, since the Ru film 21 is formed by RIE techniques so as to cover the side face of the Ta film 17, this makes the area of the storage node 22 viewed from above (a plane storage node area) larger than the plane storage node area determined by the minimum design rule for lithography. Consequently, the capacitance of the capacitor can be made larger.

Furthermore, in the manufacturing method explained later, round shapes at the time of the deposition of the Ru film 21 are left at the upper corners (Ru film 21) of the storage node 22, which sufficiently alleviates the concentration of electric fields at the upper corners. This also helps reduce leakage current in the capacitor insulating film 23.

Next, a method of manufacturing DRAM memory cells with such a storage node 22 will be explained. FIGS. 4A to 4H are sectional views showing the manufacturing method step by step. Those cross sections correspond to the cross sections taken along line A–A', line B–B', and line C–C' of FIG. 2.

In the embodiment, a case where n-channel MOS transistors are used for memory cells will be explained. The same holds true for a case where p-channel MOS transistors are used. When both n-channel MOS transistors and p-channel MOS transistors are formed on the same substrate for a peripheral circuit, a p-well and an n-well are formed at the surface of the substrate and n-channel MOS transistors are formed in the p-well and p-channel MOS transistors are formed in the n-well.

First, a (100) oriented p-type silicon substrate 1 with an impurity concentration of about $5 \times 10^{15}$ cm$^{-3}$ is prepared.

Figure 4A:
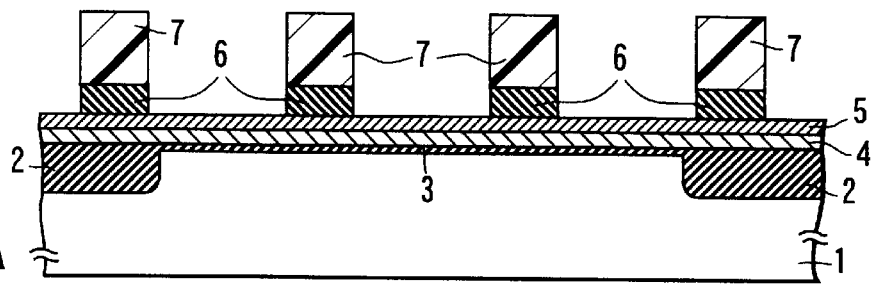
FIGS. 4A to 4H are sectional views showing step by step a method of manufacturing memory cells of the first embodiment.

Next, using, for example, reactive ion etching techniques (RIE techniques), trenches with a depth of, for example, about 0.2 μm are made at the surface of the p-type silicon substrate. The trenches are filled with an insulating film 2, thereby providing trench element isolation (STI (Shallow Trench Isolation) (FIG. 4A).

Then, after the silicon surface of the element region has been thermally oxidized to form a silicon oxide film 3 with a thickness of, for example, about 60 nm acting as a gate oxide film, a polycrystalline silicon film 4 with a thickness of about 50 nm acting as a first gate electrode and a WSi$_2$ film 5 with a thickness of about 50 nm acting as a second gate electrode are formed on the substrate in that order. The first and second gate electrodes are formed in a stacked manner to be a word line WL (FIG. 4A).

Then, after a silicon nitride film (Si$_3$N$_4$ film) acting as a gate cap layer 6 and a resist pattern 7 have been formed on the Wsi$_2$ film 5 in that order, the silicon nitride film is etched using the resist pattern 7 as a mask to form a gate cap layer 6. The gate cap layer 6 is used as an etching stopper layer for the gate electrode in a self-aligning contact process in a later process (FIG. 4A).

Figure 4B:
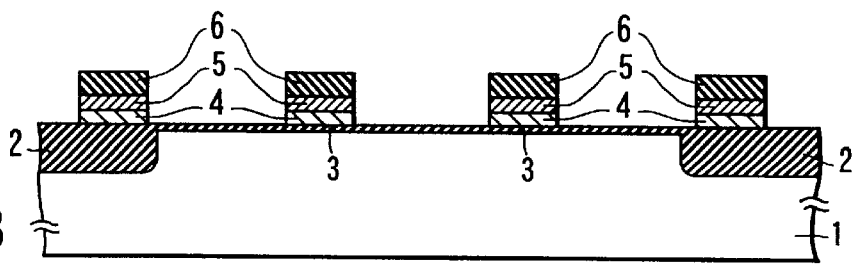

Next, after the resist pattern 7 has been peeled, the WSi$_2$ film 5 and polycrystalline silicon film 4 are etched in that order using the gate cap layer 6 as a mask to form a first gate electrode 5, a second gate electrode 4 (word line WL), and a gate oxide film 3 in a specific shape (FIG. 4B).

As a result, a polycide gate structure, a stacked structure of a polycrystalline silicon film and a WSi$_2$ film (silicide film), is formed as a gate structure. Instead, a polymetal gate structure may be formed. Furthermore, a simple single layer gate structure of a polycrystalline silicon film may be formed.

Thereafter, to improve the withstand voltage between the gate electrodes 4, 5 and a low-concentration source/drain diffused layer formed in a later process, for example, thermal oxidation or RTO (Rapid Thermal Oxidation) is performed at 1050° C. in an atmosphere of oxygen for about 100 seconds to form what is called a post-oxide film (not shown).

Figure 4C:
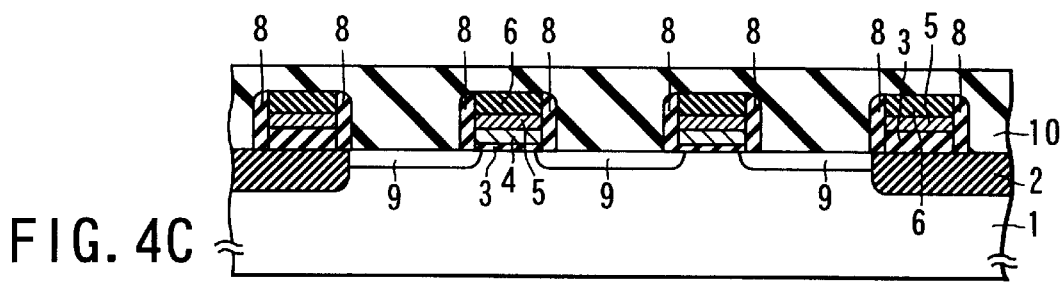

Next, a silicon nitride film (Si$_3$N$_4$ film) with a thickness of, for example, about 10 nm serving as a gate sidewall silicon nitride film 8 is formed on the entire surface. The silicon nitride film is etched by RIE techniques and left only on the sidewalls of the gate structure. This forms the gate sidewall silicon nitride film 8 (FIG. 4C).

Then, using the resist pattern (not shown) covering the regions excluding the memory cell regions, the gate cap layer 6, and gate sidewall silicon nitride film 8 as a mask, n-type impurity ions are implanted into the surface of the substrate. Thereafter, annealing is effected to form a low-impurity-concentration n-type source/drain diffused layer 9. Then, an interlayer insulating film 10 made of BPSG all of whose surface is flattened is formed (FIG. 4C).

The interlayer insulating film 10 is formed as follows. For example, after a BPSG film with a thickness of about 50 nm has been deposited on the entire surface by CVD techniques, the entire surface of the BPSG film is polished and flattened by, for example, CMP (chemical mechanical polishing) techniques until the film thickness of the BPSG film on the gate cap layer 6 becomes about 100 nm. This produces the interlayer insulating film 10.

Figure 4D:
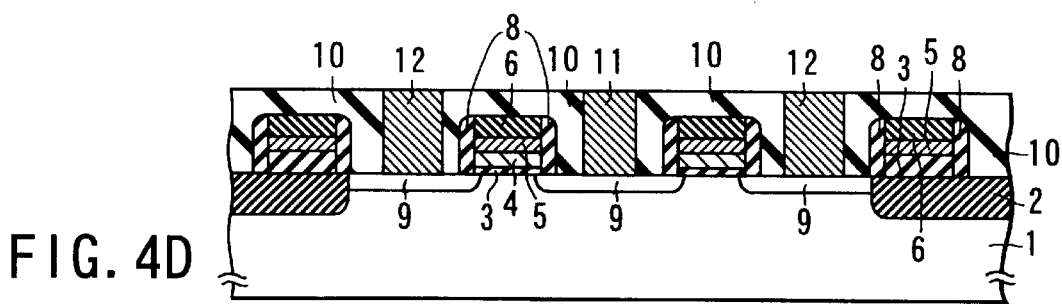

Next, the interlayer insulating film 10 is etched and contacts holes are made which allow the n-type source/drain diffused layer 9 to make contact with a bit line formed in a later process and with a plug electrode formed in a later process. Thereafter, those contact holes are filled with high-impurity-concentration n-type polycrystalline silicon films 11, 12 (FIG. 4D).

In this case, it is desirable to use the high selectivity RIE of an oxide film and a nitride film in etching the interlayer insulating film 10 to form the contact holes. Specifically, the contact holes are made by RIE under the condition that the etching rate of the BPSG film used for the interlayer insulating film 10 is 10 times or more as great as that of the silicon nitride film (Si$_3$N$_4$ film) used for the gate cap layer 6.

Use of such high selectivity RIE enables the gate cap layer 6 on the second gate electrode 5 to be removed and prevents the second gate electrode 5 from being exposed in the contact hole. This prevents the gate electrode 5 from being short-circuited to the n-type polycrystalline silicon films 11, 12, improving the yield of products.

To form the n-type polycrystalline silicon films 11, 12, for example, an n-type polycrystalline silicon film is deposited on the entire surface, the n-type polycrystalline silicon film is polished by CMP techniques, and the n-type polycrystalline silicon film outside the contact holes is removed.

Next, an interlayer insulating film 13 is deposited on the entire surface by, for example, CVD techniques, bit-line contact holes for connecting bit lines to the n-type polycrystalline silicon film 11 are made in the interlayer insulating film 13, and bit lines 14 are embedded in the bit-line contact holes in such a manner that the bit lines are electrically connected to the n-type polycrystalline silicon film 11 (what is called a dual damascene process using CMP techniques). For the bit lines 14, for example, a tungsten (W) film is used (FIG. 4E).

Figure 4E:
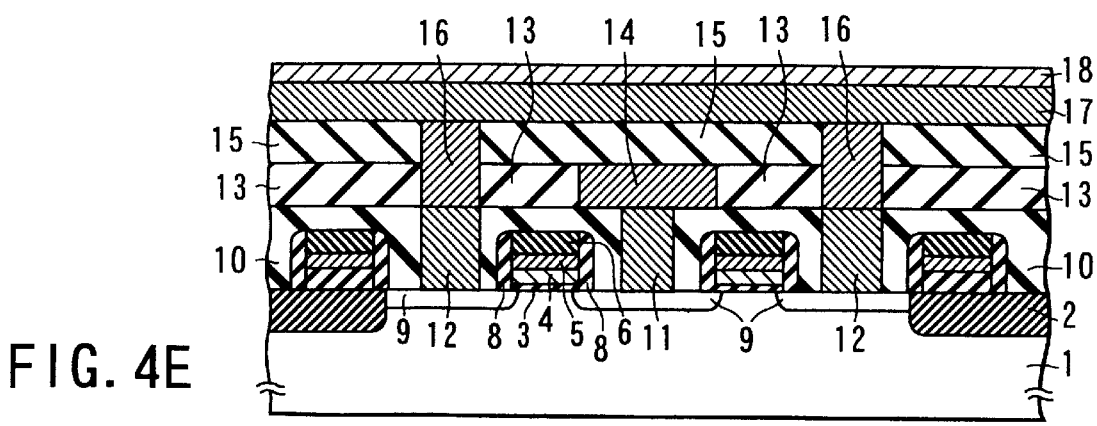

Then, after an interlayer insulating film 15 whose entire surface has been flattened has been formed, storage-node contact holes for connecting with the n-type polycrystalline silicon film 12 are made in the interlayer insulating films 13, 15 (FIG. 4E).

Next, the storage-node contact holes are filled completely with plug electrodes 16 mainly made of a tungsten film (W) in such a manner that the plug electrodes are electrically connected to the n-type polycrystalline silicon film 12 (FIG. 4E).

To form the plug electrodes 16, for example, a W film from which the plug electrodes 16 are to be formed is deposited on the entire surface and the W film on the interlayer insulating film 15 is removed by CMP techniques in such a manner that the W film is left only in the storage-node contact holes.

Thereafter, a Ta film 17 is formed on the entire surface using, for example, spattering techniques. Then, an Ru film 18 is formed on the Ta film 17 using, for example, spattering techniques (FIG. 4E). The Ta film and Ru film 18 may be formed by another film forming method, such as a CVD method, instead of the spattering method.

When the Ta film 17 has been formed, if storage-node contact holes were filled insufficiently with the plug electrodes 16, steps would develop in the Ta film 17 at the contact portion or irregularities appear in the surface of the Ta film 17 depending on the film formation conditions. If this happens, the entire surface of the Ta film 17 should be polished and flattened by CMP techniques as shown in FIG. 5B.

By doing this, the surface of the Ta film 17 including the steps in the contact portion can be flattened completely. The flattening of the Ta film 17 is effective in reducing leakage current in the capacitor insulating film.

Figure 4F:
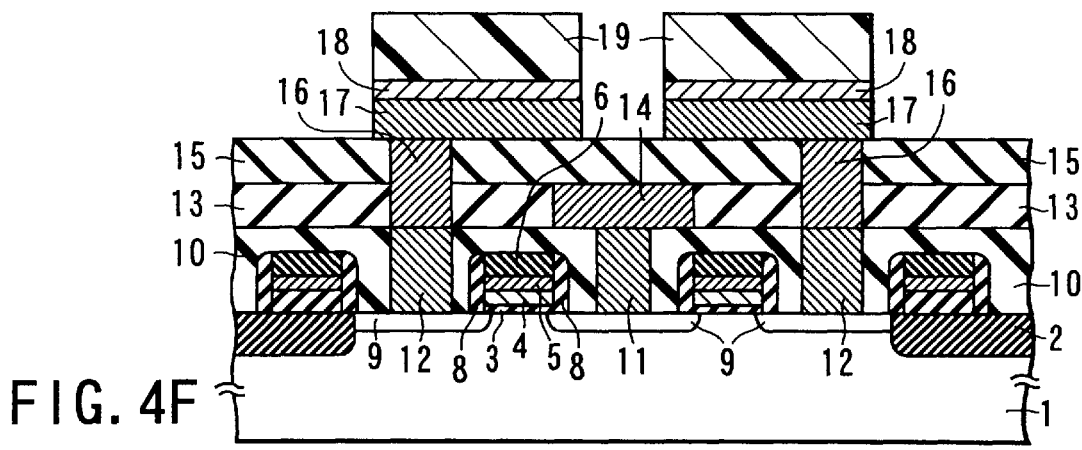

Getting back to explanation of the process, as shown in FIG. 4F, after a resist pattern 19 has been formed on the Ru film 18, the Ru film 18 and Ta film 17 are patterned by, for example, RIE techniques using the resist pattern 19 as a mask. Thereafter, the resist pattern 19 is peeled.

In this case, after the resist pattern 19 has been peeled, if an etching residue existed on the Ru film 18 and the etching residue might increase leakage current in the capacitor insulating film, the Ta film 17 should be patterned according to the following processes.

Figure 6A:
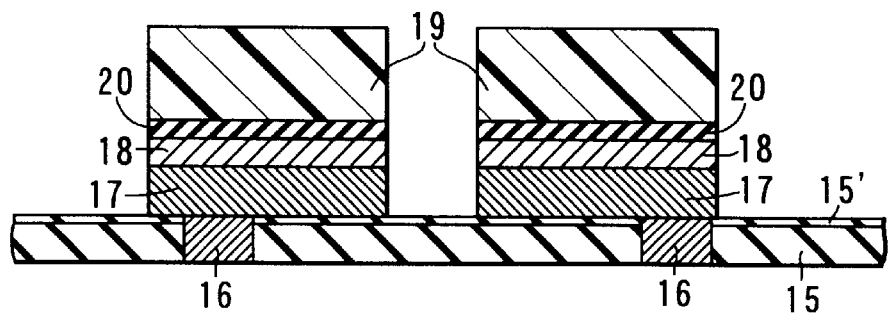
FIGS. 6A and 6B are sectional views showing step by step a method of preventing an increase in the leakage current in the capacitor insulating film caused by the etching residue appearing in the process of patterning the Ta film in the first embodiment.
Figure 6B:
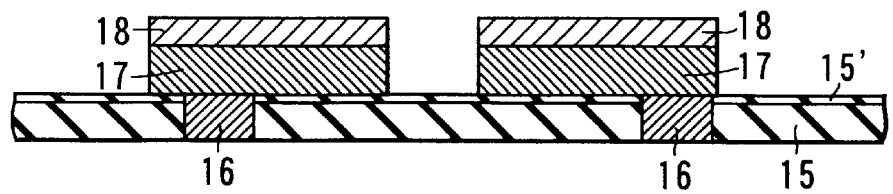

As shown in FIG. 6A, the resist pattern 19 is formed on the Ru film 18 via, for example, an SOG film 20 (protective film) with a thickness of about 50 nm, not being formed directly on the Ru film 18. Then, with the resist pattern 19 as a mask, an SOG film 20, Ru film 18, and Ta film 17 are etched continuously. Thereafter, the resist pattern 19 and SOG film 20 are removed as shown in FIG. 6B.

When the SOG film 20 is removed using an etching solution, such as $NH_4F$ solution, for example, a silicon nitride film ($Si_3N_4$ film) 15' with a thickness of about 30 nm is formed in advance to protect the interlayer insulating film 15.

With the method, the SOG film 20 prevents the Ru film 18 from being contaminated. This makes it possible to effectively suppress an increase in the leakage current in the capacitor insulating film due to the etching residue on the Ru film 18 caused in etching the Ru film 18/Ta film 17.

Figure 4G:
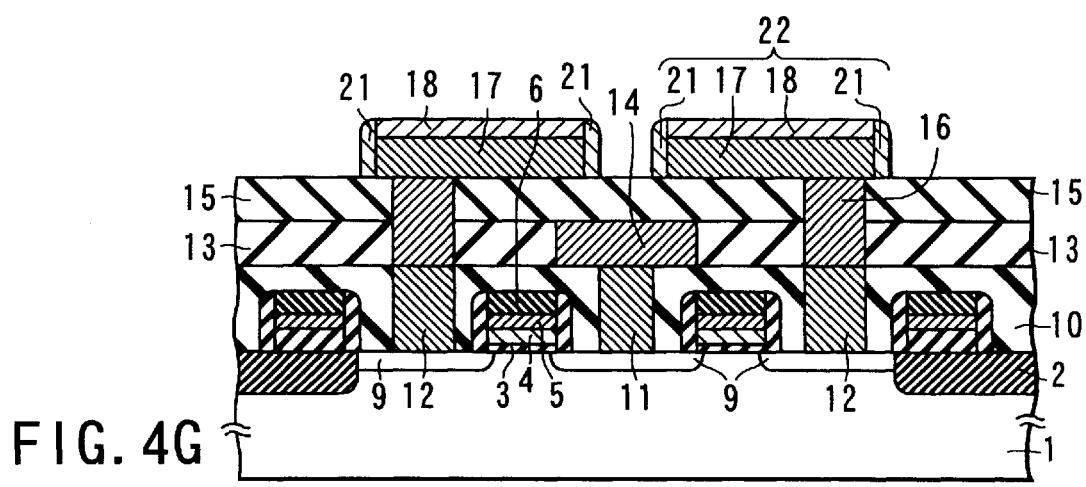

To return to explanation of the process, an Ru film 21 is formed on the sidewalls of the Ru film 18 and Ta film 17 as shown in FIG. 4G. This completes a storage node 22 with a structure where the top and side faces of the Ta film 17 are covered with the Ru films 18, 21.

The Ru film 21 is formed as follows. For example, an Ru film serving as the Ru film 21 is deposited on the entire surface using spattering or CVD techniques. Thereafter, the Ru film is etched by RIE techniques to selectively leave the Ru film 21 on the sidewalls of the Ru film 18 and Ta film 17.

Use of the sidewall insulating film forming method by RIE realizes a plane storage node area larger than the plane storage node area determined by the minimum design rule for lithography.

In the present embodiment, because the high-permittivity capacitor insulating film 23 is used, this makes the value of capacitor large. Specifically, the large capacitance is realized in terms of the shape of the capacitor and dielectric material.

Because a round shape at the time of the deposition of the Ru film 21 is left at the top corners of the storage node 22, the concentration of electric fields is alleviated at the top corners of the storage node 22. The alleviation of electric fields contributes to the reduction of leakage current in the capacitor insulating film 23 or to the improvement of the withstand voltage.

Figure 4H:
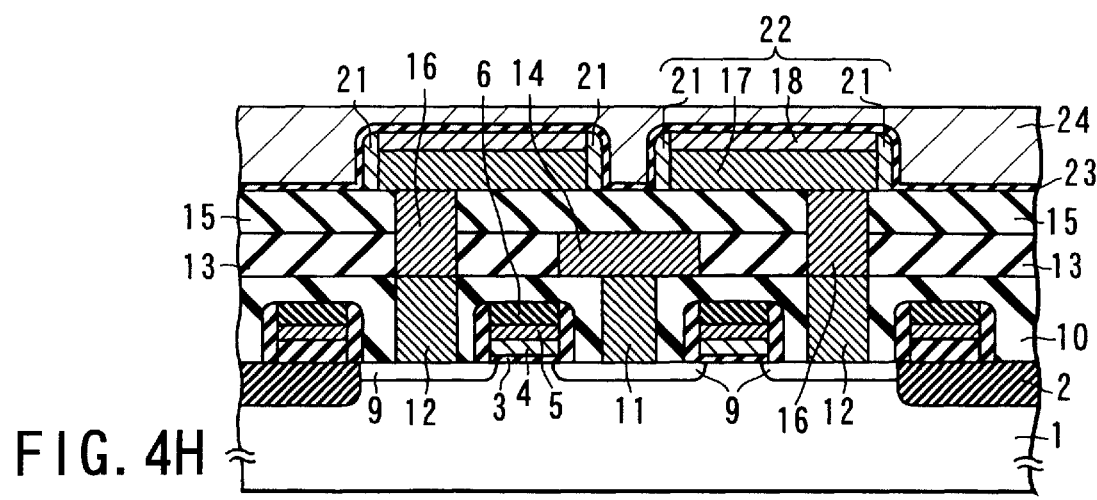

Next, as shown in FIG. 4H, a high-permittivity capacitor insulating film 23 made of (Ba, Sr) $TiO_3$ is deposited to a thickness of about 30 nm on the entire surface using spattering or CVD techniques.

Finally, an Ru film from which a plate electrode 24 is formed is deposited to a thickness of about 30 nm on the entire surface using spattering or CVD techniques. Then, the Ru film is patterned by, for example, RIE techniques, which completes the memory cells (FIG. 4H).

Use of the above-described processes makes it possible to realize a memory cell having a storage node 22 with a structure composed of the Ta film 16 whose film stress is low and which has a large volume (or which is thick) and the Ru films 18, 21 which cover the top and side faces of the Ta film 17, whose film stress is high, and which has a small volume (which is thin).

Consequently, the film stress in the storage node 22 is low on the whole. This enables leakage current in the capacitor insulating film 23 due to the film stress in the storage node 22 to be suppressed, helping reduce the leakage current.

The formation of the Ru films 18, 21 on the Ta film 17 improves the orientation of the Ru film 16, which makes the Ru films 18, 21 denser. This suppresses the surface roughness of the Ru films 18, 21 caused by a thermal process in a later process, for example, by a thermal process in the process of forming, for example, the capacitor insulating film 23. Consequently, a leakage current in the capacitor insulating film 23 caused by the surface roughness of the Ru films 18, 21 can be suppressed.

As described above, because the formation of the Ru film 21 as a sidewall insulating film makes the plane storage node area larger, the value of the capacitor can be made larger and the concentration of electric fields can be alleviated at the top corners of the storage node 22, which suppresses an increase in the leakage current.

While in the embodiment, a Ta film is used as the first lower capacitor electrode, a conductive film made of, for example, a metal film, such as an Nb film, a W film, or a Ti film, or a compound, such as a silicide film of these or a nitride film of these, may be used. Furthermore, while an Ru film is used as the second lower capacitor electrode, a noble metal conductive film, such as a Pt film, an Re film, an Os film, a Pd film, an Rh film, or an Au film, or a metal film, such as $SrRuO_3$, $RuO_2$, Ir, or $IrO_2$, or a metal oxide film may be used. Combinations of these must meet the condition that the film stress in the first lower capacitor electrode is lower than that in the second lower capacitor electrode.

(Second Embodiment)

FIGS. 7A to 7F are sectional views showing step by step a method of manufacturing DRAM memory cells according to a second embodiment of the present invention. The cross sections in the figures correspond to the cross sections taken continuously along line A–A', line B–B', and line C–C' of FIG. 2. Since the second embodiment differs from the first embodiment only in the way of forming a storage node, illustrations and explanation are limited to the related processes.

Figure 5A:
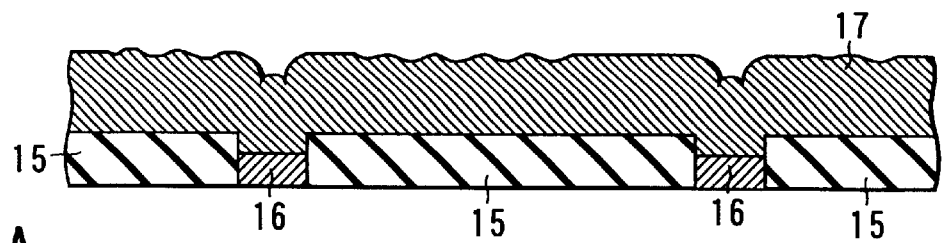
FIGS. 5A and 5B are sectional views showing step by step preferred processes that should be performed before the formation of an Ru film when steps or irregularities have developed at the surface of a Ta film in the first embodiment.
Figure 5B:
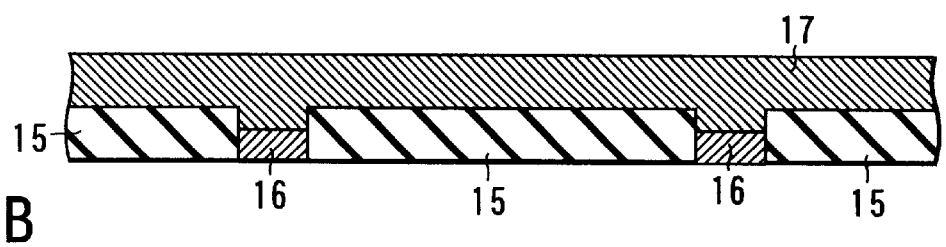
Figure 7A:
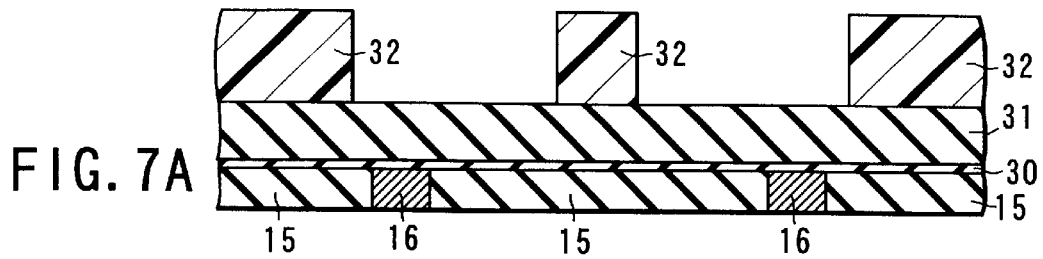
FIGS. 7A to 7F are sectional views showing step by step a method of manufacturing stacked DRAM memory cells according to a second embodiment of the present invention.

After the process of forming plug electrodes 16 shown in FIG. 5E of the first embodiment, a silicon nitride film ($Si_3N_4$ film) 30 with a thickness of about 30 nm and a TEOS oxide film 31 with a thickness of about 300 nm are formed on the entire surface in that order (FIG. 7A).

Then, on the TEOS oxide film 31, a resist pattern 32 having an opening in a storage node formation region is formed (FIG. 7A).

Figure 7B:
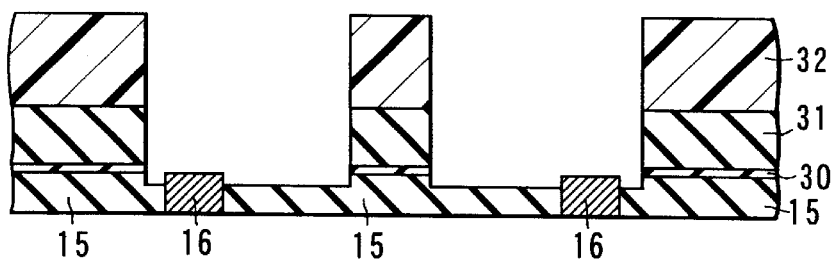

Next, with the resist pattern 32 as a mask, the TEOS oxide film 31, silicon nitride film 30, and interlayer insulating film 15 are etched continuously using RIE techniques to form storage node grooves. This causes the top of the bit lines (W film) 16 embedded in the interlayer insulating film 15 to be exposed. Thereafter, the resist pattern 32 is peeled (FIG. 7B).

Figure 7C:
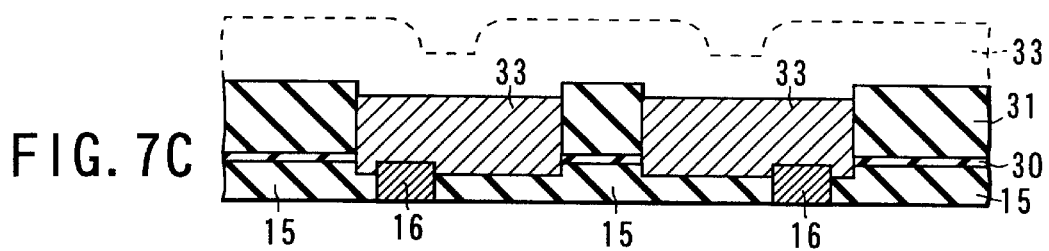

Then, a Ta film 33 is deposited to a thickness of, for example, about 300 nm on the entire surface by spattering or CVD techniques and the surface of the Ta film is flattened by, for example, CMP techniques. Then, the surface of the Ta film 33 is retreated by, for example, RIE techniques in such a manner that the surface of the Ta film 33 in the storage node groove is about 50 nm shallower than the surface of the TEOS oxide film 31 (the top face of the storage node groove) (FIG. 7C).

Figure 7D:
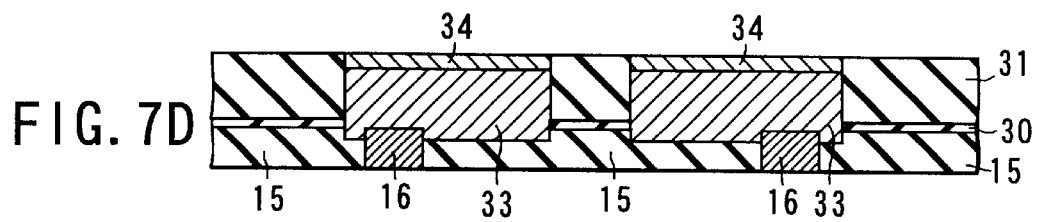

After an Ru film 34 has been deposited to a thickness of about 200 nm on the entire surface by spattering or CVD techniques, the Ru film 34 is flattened by, for example, CMP techniques. Thereafter, the storage node grooves are filled completely with the Ru film 34 (FIG. 7D).

Figure 7E:
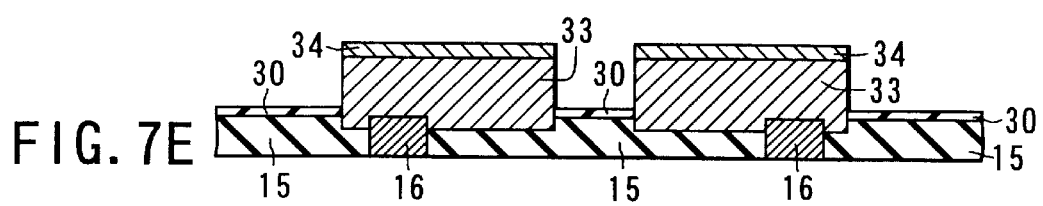
Figure 7F:
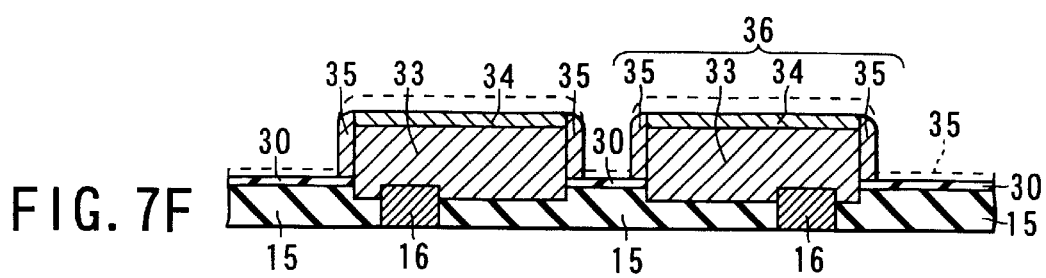

Next, with the regions excluding the memory cell regions being covered with a resist (not shown), the TEOS oxide film 31 in the memory cell regions is selectively removed by wet etching using an etching solution, such as an $NH_4F$ solution (FIG. 7E).

This causes the height of the storage nodes (Ru film 34) in the memory cell regions to coincide with the height of the TEOS oxide films in the regions other than the memory cell regions, which makes the steps in the memory cell regions having storage nodes almost equal to the steps in the regions (e.g., the peripheral regions) having no storage nodes. It is very important to make steps equal to each other in the processes of manufacturing stacked DRAMs.

Next, an Ru film 35 is deposited on the entire surface by spattering or CVD techniques and the entire surface of the Ru film 35 is subjected to RIE to form a Ru film 35 on the side faces of the Ru film 34 and Ta film 33.

This completes a storage node 36 composed of the Ta film 33 whose film stress is low and which has a large volume (which is thick) and the Ru films 34, 35 which cover the top and side faces of the Ta film 33, whose film stress is high, and which volume is small (which is thin). The subsequent processes are similar to those in the first embodiment.

The second embodiment produces the same effect as the first embodiment. In the second embodiment, the side face of the interlayer insulating film 15 of the Ta film 33 is covered with a silicon nitride film 30 and the Ru film 35 on the side face is located higher than the bottom surface of the Ta film 33. Specifically, because a capacitor insulating film is not formed at the lower corners of the Ta film 33, a leakage current in a capacitor insulating film is less liable to develop at the lower corners of the storage nodes 36.

The present invention is not limited to the above embodiment. For instance, while in the embodiment, the invention has been applied to the capacitor in a DRAM memory cell, it may be applied to capacitors in other semiconductor devices.

As described above, use of a (Ba, Sr)$TiO_3$ film as a capacitor insulating film makes the capacitance of the capacitor large. To make the capacitance larger, the area of the capacitor should be made larger. To do this, the lower capacitor electrode must be made thicker. When only Ru is used as the lower capacitor electrode, since the stress in Ru is as high as 1 GPa or more, an Ru film with a thickness of 200 nm or more would peel away after the formation of the Ru film. The peeled lower capacitor electrodes (Ru film) would turn to dust (particles). This causes the problems of lowering the withstand voltage of the capacitor, increasing a leakage current, or preventing the achievement of high capacitance.

Hereinafter, embodiments related to a structure that enables Ru to be used as the lower capacitor electrode and prevents the lower capacitor electrode from peeling off.

(Third Embodiment)

Figure 8:
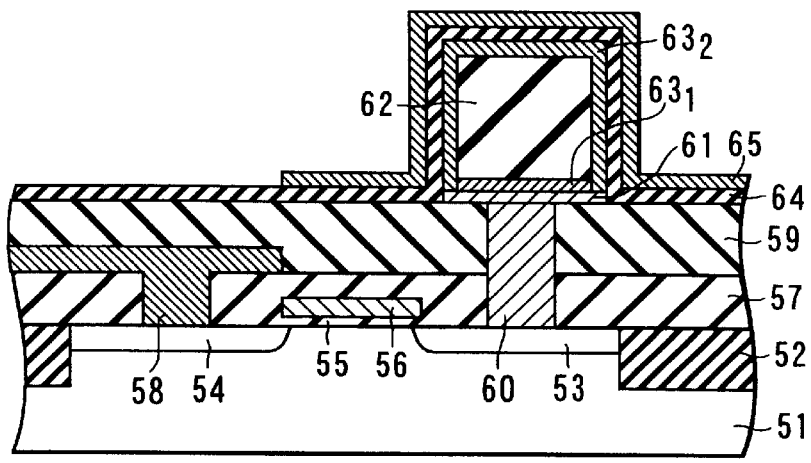
FIG. 8 is a sectional view of a DRAM memory cell according to a third embodiment of the present invention.

FIG. 8 is a sectional view of a DRAM memory cell according to a third embodiment of the present invention.

In FIG. 8, numeral 51 indicates a p-type silicon substrate. At the surface of the p-type silicon substrate 51, element isolating regions 52 of an STI structure are formed. In an element region defined by the element isolating regions 52, a memory cell composed of a MOS transistor and a stacked capacitor is formed.

A MOS transistor comprises an $n^+$-type drain diffused layer 53 selectively formed at the surface of the p-type silicon substrate 51, an $n^+$-type source diffused layer 54 selectively formed at the surface of the p-type silicon substrate 51 and separated a specific distance from the $n^+$-type drain diffused layer 53, and a gate electrode (word line) 56 formed via a gate insulating film 55 on the p-type silicon substrate 51 between the $n^+$-type source diffused layer 54 and $n^+$-type drain diffused layer 53.

On the MOS transistor, a first interlayer insulating film 57 whose surface is flattened is formed. A first contact hole reaching the $n^+$-type source diffused layer 54 is made in the first interlayer insulating film 57. A bit line 58 connecting with the $n^+$-type source diffused layer 54 via the first contact hole is formed.

On the first interlayer insulating film 57, a second interlayer insulating film 59 whose surface is flattened is formed. A second contact hole reaching the $n^+$-type drain diffused layer 53 is made in the first and second interlayer insulating films 57, 59. A contact plug 60 connecting with the $n^+$-type drain diffused layer 53 via the second contact hole is formed. The material for the contact plug 60 is $n^+$-type polycrystalline silicon.

On the second interlayer insulating film 59, an $n^+$-type polycrystalline silicon film 61 connecting with the contact plug 60 is formed. A lower capacitor electrode is formed on the $n^+$-type polycrystalline silicon film 61.

The lower capacitor electrode is composed of a cylindrical $SiO_2$ film 62, a thin first Ru film $63_1$ containing a trace amount of oxygen that covers the undersurface of the $SiO_2$ film 62, and a thin second Ru film $63_2$ that covers the top and side faces of the $SiO_2$ film 62.

Then, on the region including the lower capacitor electrode, an Ru film 65 acting as an upper capacitor electrode is formed via a (Ba, Sr)$TiO_3$ film 64 acting as a capacitor insulating film.

The lower capacitor electrode of the capacitor of the third embodiment is such that the entire surface of the $SiO_2$ film 62 is covered with the Ru films $63_1$, $63_2$. With this structure, the surface area of the lower capacitor electrode can be made larger easily by making the $SiO_2$ film 62 thicker to make its surface area larger. Therefore, it is not necessary to make the first and second Ru films $63_1$, $63_2$ thicker to make the capacitance of the capacitor larger. This allows the Ru films $63_1$, $63_2$ to remain thin.

If the Ru films $63_1$, $63_2$ are thin, the Ru films $63_1$, $63_2$ will not peel off after they have been formed. This avoids various problems caused by the pealing off of the Ru films $63_1$, $63_2$. One of the problems is that the peeled Ru films $63_1$, $63_2$ turn to dust (particles), which lowers the withstand voltage of the capacitor or increases a leakage current preventing the achievement of higher capacitance.

As long as the higher integration (miniaturization) of circuits is not impeded, the capacitance of the capacitor may be made far larger by not only thickening the $SiO_2$ film 62 but also widening the $SiO_2$ film 62.

Hereinafter, a method of forming a memory cell constructed as described above will be explained. FIGS. 9A to 9H are sectional views showing step by step a method of forming a memory cell of the third embodiment.

Figure 9A:
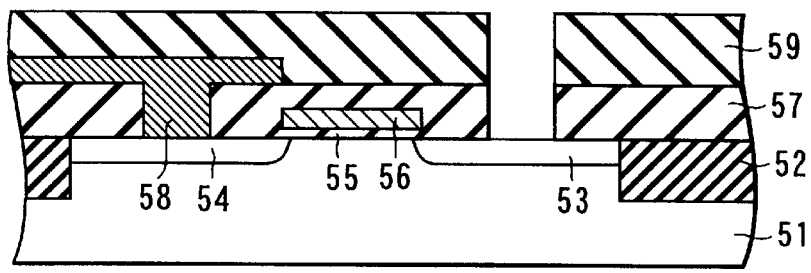
FIGS. 9A to 9H are sectional views showing step by step a method of forming memory cells of the third embodiment.

As shown in FIG. 9A, after an STI element isolating region 52 has been formed at the surface of a p-type silicon substrate 51, a gate insulating film 55 and a gate electrode 56 are formed. Then, with the gate electrode 56 as a mask, after n-type impurity ions have been implanted into the surface of the substrate, annealing is effected to form an $n^+$-type drain diffused layer 53 and an $n^+$-type source diffused layer 54 in a self-aligning manner.

Next, a first interlayer insulating film 57 whose surface is flat is formed on the entire surface. Then, after a first contact hole reaching the $n^+$-type source diffused layer 54 has been made in the first interlayer insulating film 57, a bit line 58 connecting with the $n^+$-type source diffused layer 54 is formed. The first interlayer insulating film 57 is formed by depositing an insulating film and flattening the surface of the insulating film by, for example, CMP techniques (FIG. 9A).

Next, a second interlayer insulating film 59 whose surface is flat is formed on the entire surface. Then, a second contact hole reaching the $n^+$-type drain diffused layer 53 has been made in the first and second interlayer insulating films 57, 59. The second interlayer insulating film 59 is formed by depositing an insulating film and flattening the surface of the insulating film by, for example, CMP techniques (FIG. 9A).

Figure 9B:
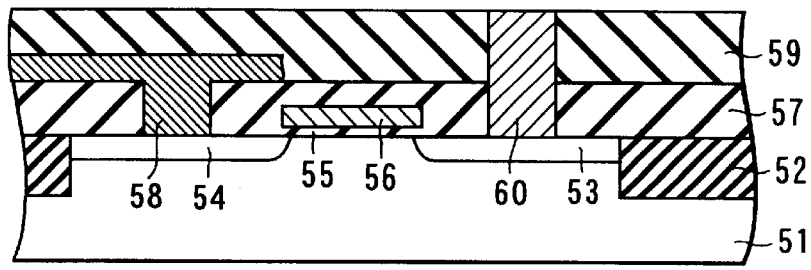

Then, after an $n^+$-type polycrystalline. silicon film acting as a contact plug 60 has been formed so as to fill the second contact hole, the entire surface of the $n^+$-type polycrystalline silicon film is retreated by etch back or CMP techniques to form the contact plug 60 in the second contact hole in such a manner that the plug 60 is embedded in the hole (FIG. 9B). Thus far, the processes are the same as those in the prior art.

Figure 9C:
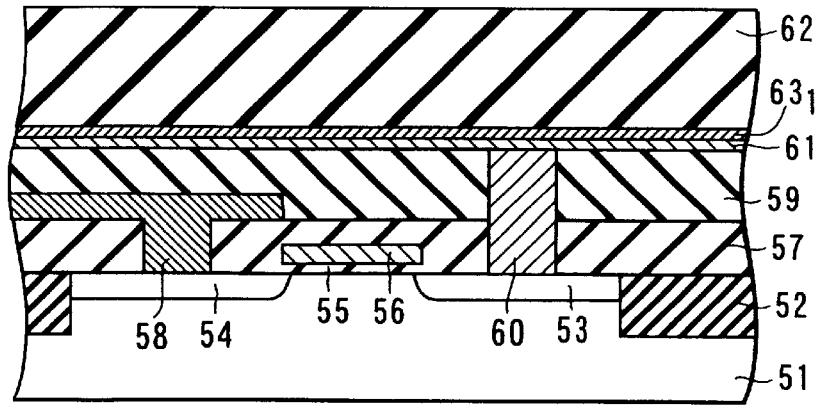

Next, after an $n^+$-type polycrystalline silicon film 61 has been formed on the entire surface, a thin first Ru film $63_1$ containing a trace amount of oxygen is formed on the $n^+$-type polycrystalline silicon film 61 by spattering techniques. Because the first Ru film $63_1$ is thin, it will not peel off after it has been formed. Thereafter, an $SiO_2$ film 62 is formed on the first Ru film $63_1$ (FIG. 9C).

Figure 9D:
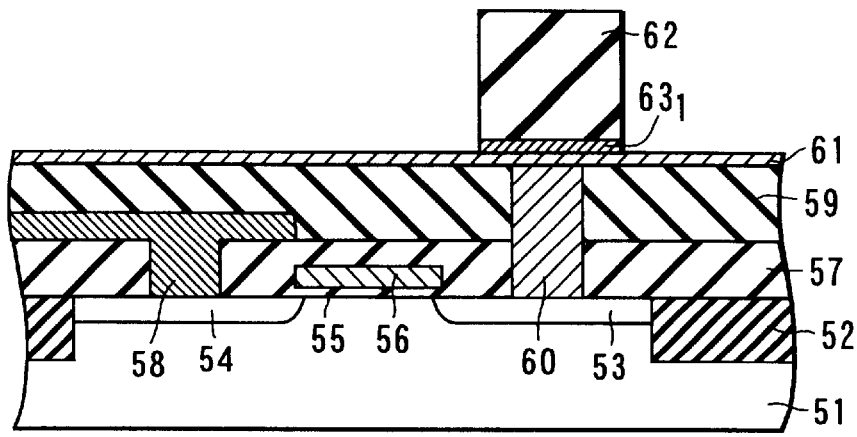

Then, using photolithography and RIE, the first Ru film $63_1$ and $SiO_2$ film 62 are processed into cylindrical shape. These first Ru film $63_1$ and $SiO_2$ film 62 are present on the contact plug 60. The first Ru film $63_1$ and $SiO_2$ film 62 may be processed into other shapes other than cylindrical shape (FIG. 9D).

Figure 9E:
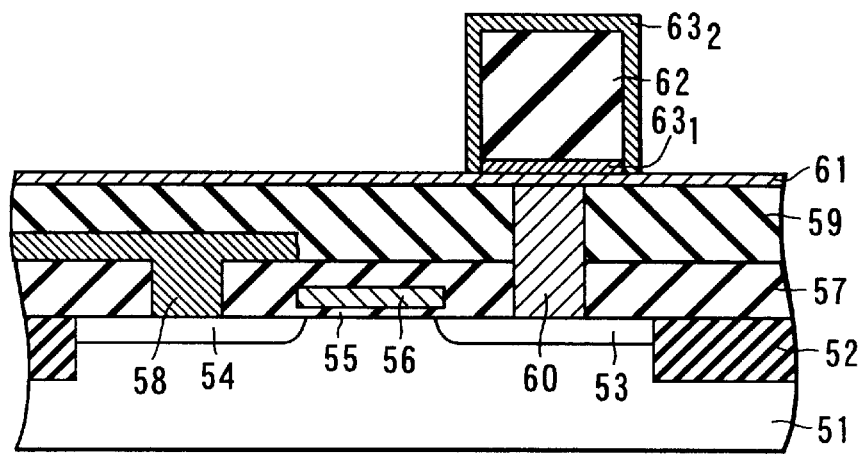

Next, a thin second Ru film $63_2$ is selectively formed on the surface of the first Ru film $63_1$ and $SiO_2$ film 62 by CVD techniques (FIG. 9E).

Specifically, for example, the substrate temperature is set in the range from 200° C. to 450° C. and the film formation pressure is set in the range from 1 Pa to 100 Pa. Ar gas is used as carrier gas. $Ru(C_5H_5)_2$ (biscyclopentadienylruthenium, hereinafter, abbreviated as Ru(Cp)2) gas is introduced into a film formation chamber. Furthermore, $O_2$ gas is introduced into the film formation chamber so that the concentration of $O_2$ in an atmosphere may be 40% or less. Under these conditions, the Ru film $63_2$ is selectively formed. Because the second Ru film $63_2$ is thin, it will not peel off after it has been formed.

This completes a lower capacitor electrode composed of the cylindrical $SiO_2$ film 62, the first Ru film $63_1$ covering the undersurface of the $SiO_2$ film 62, and the second Ru film $63_2$ covering the top and side faces of the $SiO_2$ film 62.

As described above, with the third embodiment, because the second Ru film $63_2$ has been selectively formed on the surfaces of the first Ru film $63_1$ and $SiO_2$ film 62, the second Ru film $63_2$ is not formed on the $n^+$-type polycrystalline silicon film 61. This eliminates the process of removing an extra second Ru film $63_2$ on the $n^+$-type polycrystalline silicon film 61, preventing an increase in the number of processes (FIG. 9E).

Figure 9F:
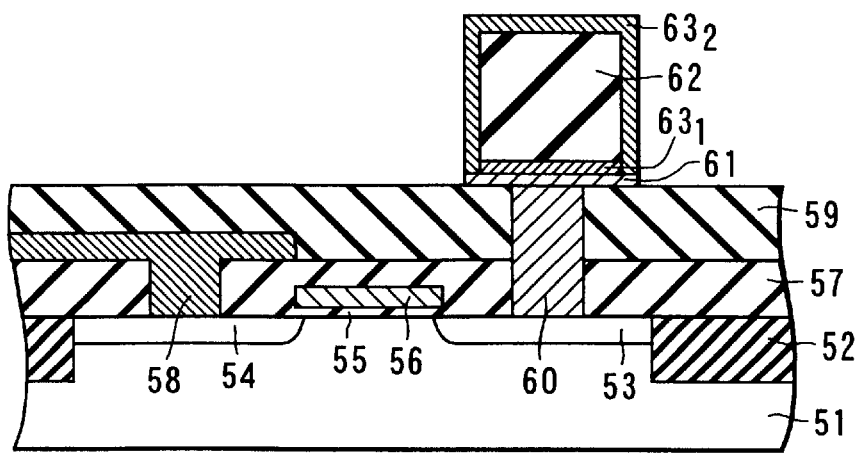

Next, the exposed $n^+$-type polycrystalline silicon film 61 is selectively etched away by RIE techniques (FIG. 9F).

Figure 9G:
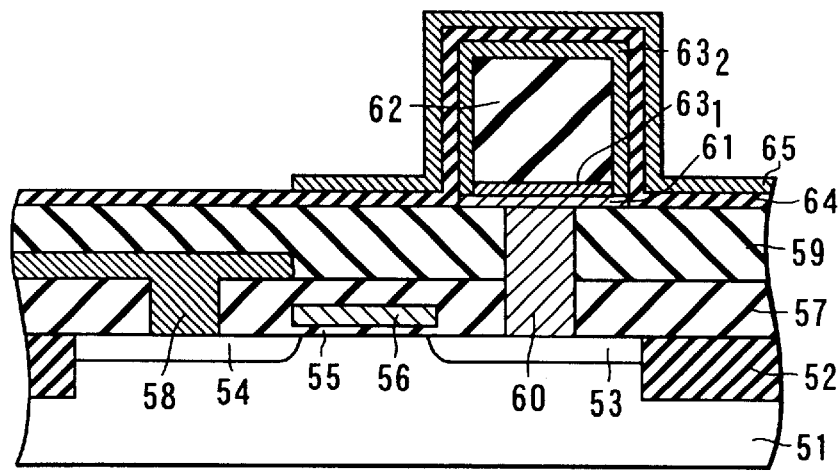

Then, a $(Ba, Sr)TiO_3$ film 64, a high-permittivity insulating film, is formed as a capacitor insulating film on the entire surface (FIG. 9G).

Finally, a thin Ru film 65 acting as an upper capacitor electrode is formed on the $(Ba, Sr)TiO_3$ film 64 by CVD techniques (FIG. 9G).

Specifically, for example, the substrate temperature is set at 350° C. and the film formation pressure is set at 50 Pa. After a thin Ru film has been formed on the entire surface by CVD techniques using $Ru(Cp)_2$ gas (carrier gas: Ar gas) and $O_2$ gas, the Ru film is processed by photolithography and RIE to form a thin film 65 acting as the upper capacitor electrode.

Because the Ru film 65 is thin, it will not peel off after it has been formed. Since the formation of the Ru film 65 requires no selectivity, there is no particular limitation on the substrate temperature and film formation pressure. The material for the Ru film is not restricted to $Ru(Cp)_2$. For instance, such organic source as $Ru_3(CO)_{12}$ or $Ru(THD)_2$, such halide as $RuF_4$ or $RuCl_4$, or such oxide as $RuO_4$ may be used as the material for the Ru film.

Figure 9H:
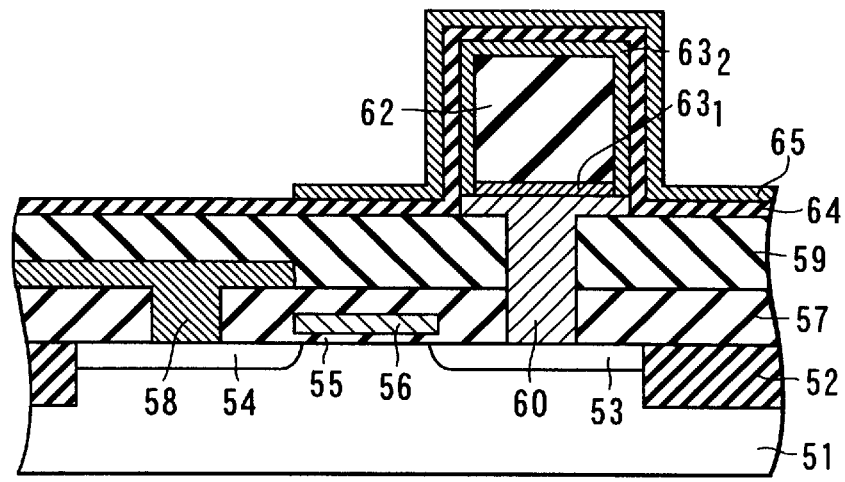

While in the embodiment, the $n^+$-type polycrystalline silicon film (contact plug) 60 is formed in the second contact hole in such a manner that the film 60 is embedded in he contact hole in the process of FIG. 9B and then the $n^+$-type polycrystalline silicon film 61 is formed in the process of FIG. 9C, the $n^+$-type polycrystalline silicon film 60 may be substituted for the $n^+$-type polycrystalline silicon film 61 as shown in FIG. 9H.

In this case, after the $n^+$-type polycrystalline silicon film 60 has been formed on the entire surface in the process of FIG. 9B in such a manner that the film 60 fills the second contact hole, the surface of the $n^+$-type polycrystalline silicon film 60 is flattened.

In the third embodiment, the entire surface of the $SiO_2$ film 62 covered with the Ru films $63_1$, $63_2$ is used as the lower capacitor electrode. In addition, by making the $SiO_2$ film 62 thicker and the Ru films $63_1$, $63_2$ thinner, it is possible to realize a memory cell with a capacitor which has a large capacitance and is free from the problem of degrading the reliability, such as decreasing the withstand voltage. Such memory cells can be formed without increasing the number of processes.

(Fourth Embodiment)

Figure 10:
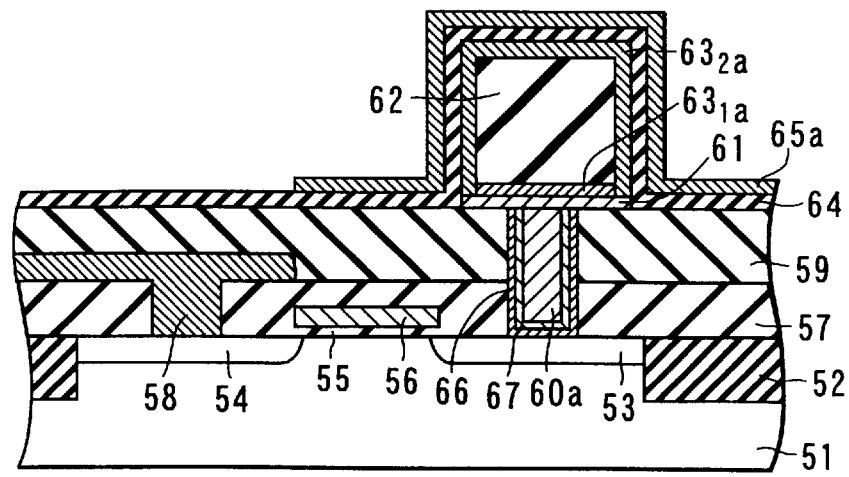
FIG. 10 is a sectional view of a DRAM memory cell according to a fourth embodiment of the present invention.

FIG. 10 is a sectional view of a DRAM memory cell according to a fourth embodiment of the present invention. The parts corresponding to those of the memory cell in FIG. 8 are indicated by the same reference symbols and a detailed explanation of them will not be given (the same is true for other embodiments hereinafter).

The forth embodiment differs mainly from the third embodiment in that the second contact hole is filled with a contact plug 60a made of metal and in that $RuO_2$ films $63_{1a}$, $63_{2a}$ and an $RuO_2$ film $65_a$ are used as the lower capacitor electrode and the upper capacitor electrode, respectively. A tungsten film is used as the contact plug 60a.

On the inside face (the side and bottom faces).of the second contact hole, a stacked film (reaction prevention film) of a Ti film 66 and a TiN film 67 is formed to prevent the contact plug 60a from reacting with the $n^+$-type drain diffused layer 53. There is no problem even when the Ti film 66 in contact with the n$^+$-type drain diffused layer 53 reacts with the n$^+$-type drain diffused layer 53 to form TiSi$_2$.

FIGS. 11A to 11F are sectional views showing step by step a method of forming a memory cell of the fourth embodiment.

After the process shown in FIG. 9A of the third embodiment, a contact plug film 60a is formed in the second contact hole via a Ti film 66 and a TiN film 67 in such a manner that the plug film 60a is embedded in the second contact hole.

Specifically, for example, after tungsten films acting as the Ti film 66, TiN film 67, and contact plug film 60a have been formed in that order on the entire surface in such a manner that they fill the. second contact hole, the extra Ti film 66, TiN film 67, and tungsten film on the second interlayer insulating film 59 are removed by etch back or CMP techniques, thereby forming the contact plug 60a.

Next, after an n$^+$-type polycrystalline silicon film 61 has been formed on the entire surface, a thin first RuO$_2$ film 63$_{1a}$ is formed by spattering techniques on the n$^+$-type polycrystalline silicon film 61. Because the first RuO$_2$ film 63$_{1a}$ is thin, it will not peel off after it has been formed. Thereafter, an SiO$_2$ film 62 is formed on the first RuO$_2$ film 63$_{1a}$ (FIG. 11B).

Then, using photolithography and RIE, the first RuO$_2$ film 63$_{1a}$ and SiO$_2$ film 62 are processed into cylindrical shape. These first RuO$_2$ film 63$_{1a}$ and SiO$_2$ film 62 are present on the contact plug 60a (FIG. 11C).

Figure 11A:
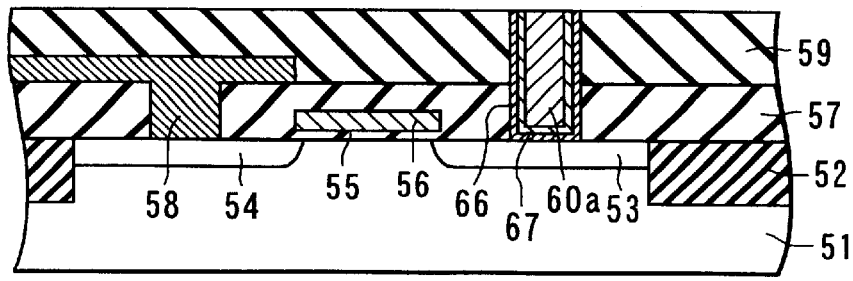
FIGS. 11A to 11F are sectional views showing step by step a method of forming memory cells of the fourth embodiment.
Figure 11B:
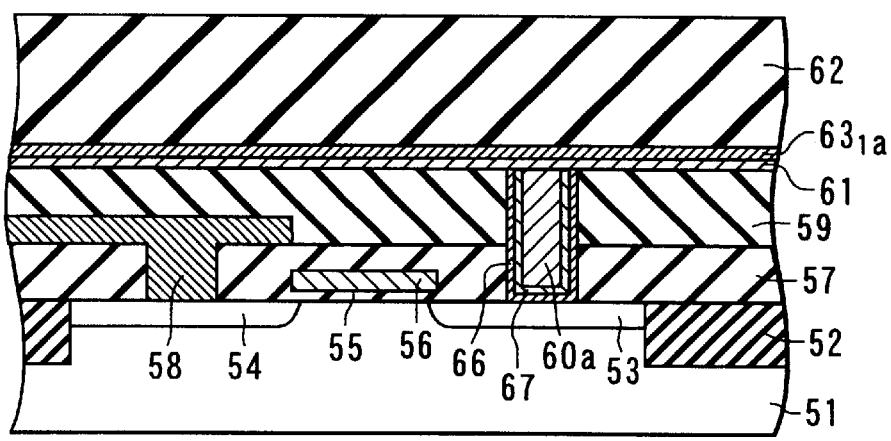
Figure 11C:
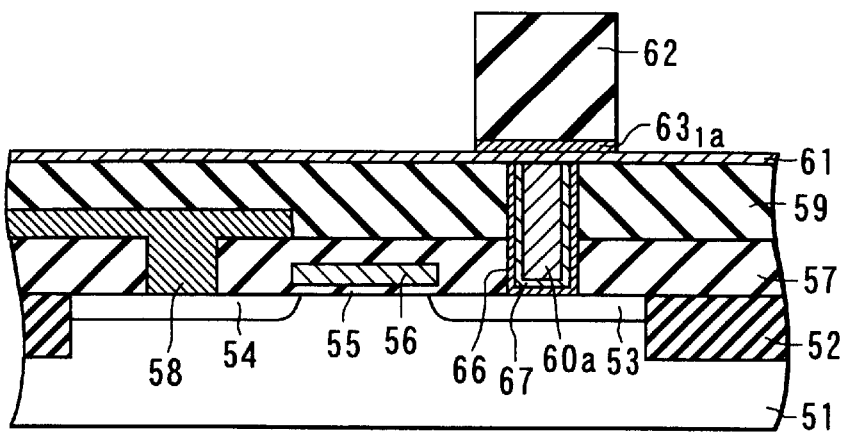
Figure 11D:
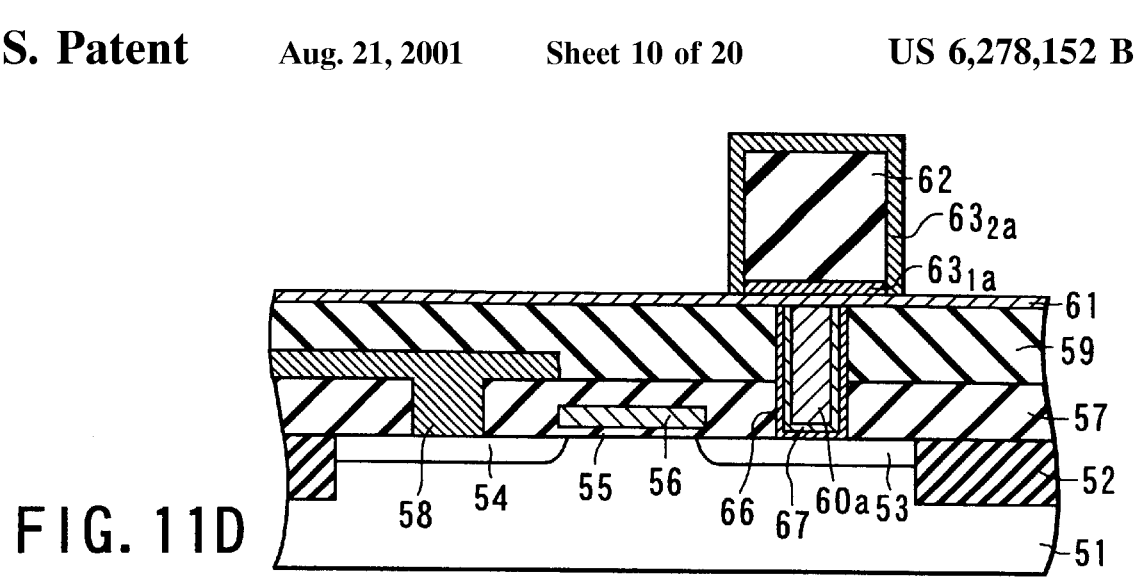

Next, a thin second RuO$_2$ film 63$_{2a}$ is selectively formed on the surfaces of the first RuO$_2$ film 63$_{1a}$ and SiO$_2$ film 62 by CVD techniques (FIG. 11D).

Specifically, for example, the substrate temperature is set in the range from 200° C. to 450° C. and the film formation pressure is set in the range from 1 Pa to 100 Pa. Ar gas is used as carrier gas. Ru(CH$_3$C$_5$H$_4$)$_2$ (bismethylcyclopentadienylruthenium, hereinafter, abbreviated as Ru(MeCp)$_2$) gas is introduced into a film formation chamber. Furthermore, O$_2$ gas is introduced into the film formation chamber so that the concentration of O$_2$ in an atmosphere may be 40% or more. Under these conditions, the second RuO$_2$ film 63$_{2a}$ is selectively formed.

Figure 11E:
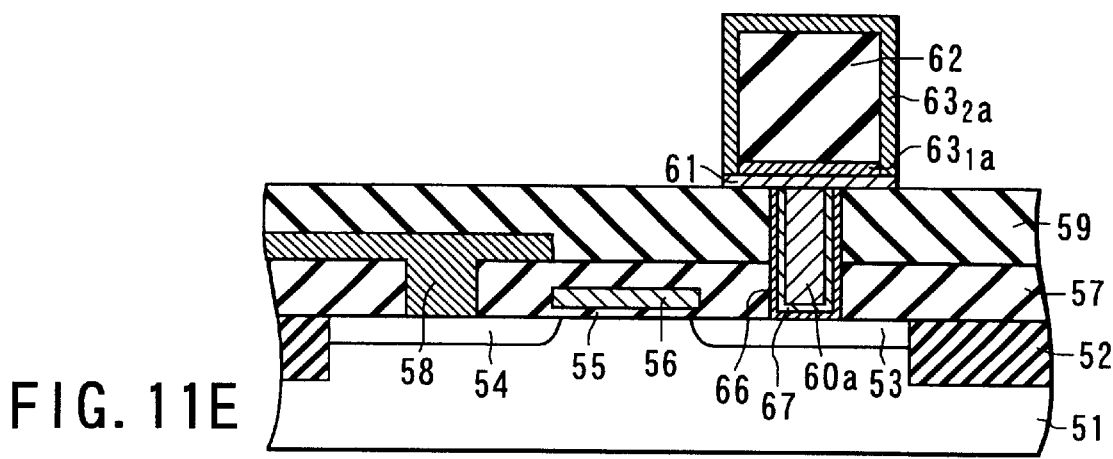

Next, the exposed n$^+$-type polycrystalline silicon film 61 is selectively etched away by RIE techniques (FIG. 11E).

Figure 11F:
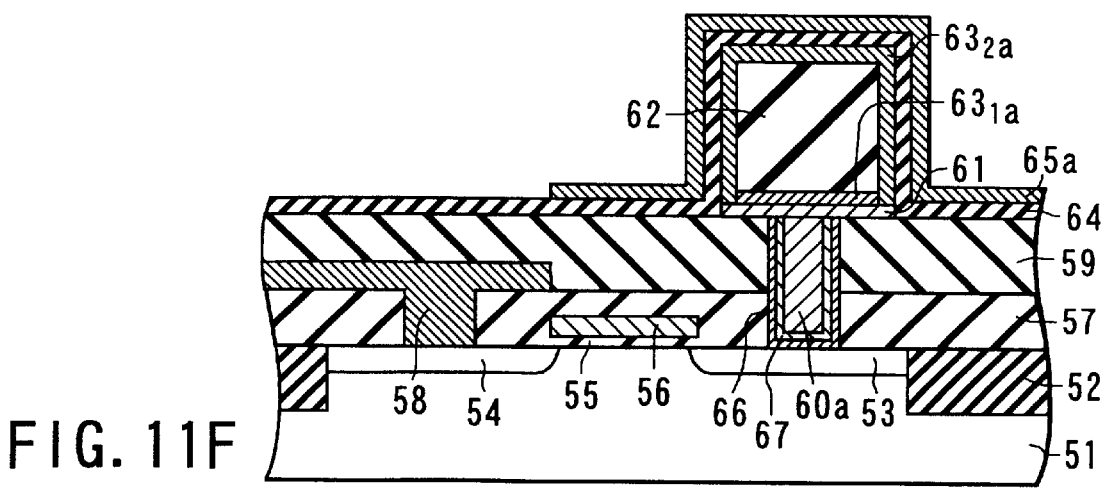

Then, a (Ba, Sr)TiO$_3$ film 64 is formed as a capacitor insulating film on the entire surface (FIG. 11F).

Finally, a thin RuO$_2$ film 65$_a$ acting as an upper capacitor electrode is formed on the (Ba, Sr)TiO$_3$ film 64 by CVD techniques (FIG. 11F).

Specifically, for example, the substrate temperature is set at 350° C. and the film formation pressure is set at 50 Pa. After a thin RuO$_2$ film has been formed on the entire surface by CVD techniques using Ru(MeCp)$_2$ gas (carrier gas: Ar gas) and O$_2$ gas, the RuO$_2$ film is processed by photolithography and RIE to form a thin RuO$_2$ film 65$_a$ acting as the upper capacitor electrode.

The RuO$_2$ film is oxide and presents metallic conductivity. Therefore, when the entire surface of the SiO$_2$ film 62 covered with the thin RuO$_2$ films 63$_{1a}$, 63$_{2a}$ is used as the lower capacitor electrode as in the fourth embodiment, this produces the same effect as in the third embodiment.

(Fifth Embodiment)

Figure 12:
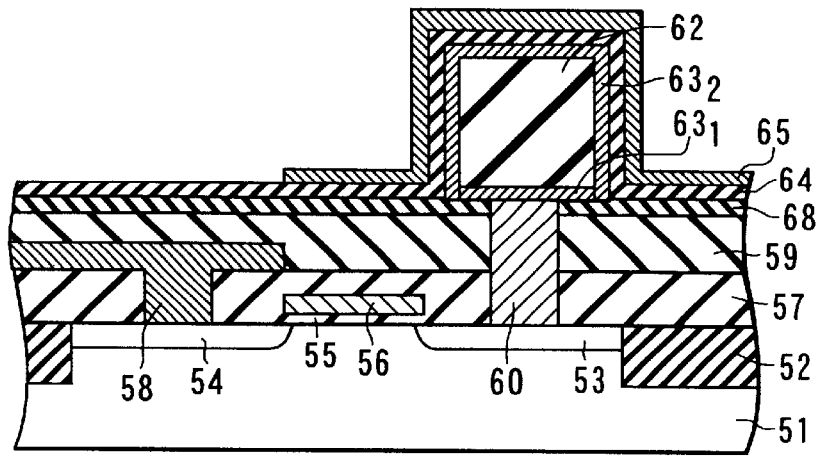
FIG. 12 is a sectional view of a DRAM memory cell according to a fifth embodiment of the present invention.

FIG. 12 is a sectional view of a DRAM memory cell according to a fifth embodiment of the present invention.

The fifth embodiment differs mainly from the third embodiment in that the surface of a second interlayer insulating film 59 is covered with a silicon nitride film 68. A contact plug 60 is in direct contact with a lower capacitor electrode (a first Ru film 63$_1$).

FIGS. 13A to 13F are sectional views showing step by step a method of forming a memory cell of the fifth embodiment.

Figure 13A:
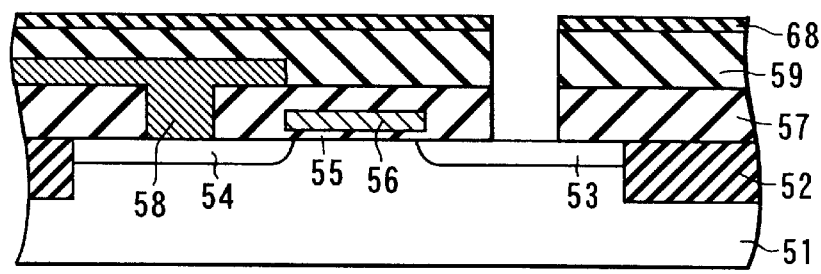
FIGS. 13A to 13F are sectional views showing step by step a method of forming memory cells of the fifth embodiment.

First, as shown in FIG. 13A, an element isolating region 52, an n$^+$-type drain diffused layer 53, an n$^+$-type source diffused layer 54, a gate insulating film 55, a gate electrode 56, a first interlayer insulating film 57, and a bit line 58 are formed on a p-type silicon substrate 51 as in the third embodiment.

Next, after a second interlayer insulating film 59 has been formed on the entire surface and a silicon nitride film 68 has been formed on the second interlayer insulating film 59, a second contact hole reaching the n$^+$-type drain diffused layer 53 is made in the first and second interlayer insulating films 57, 59 and silicon nitride film 68 (FIG. 13A).

Figure 13B:
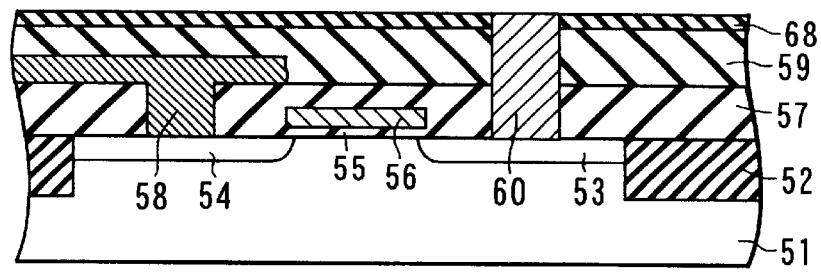

Then, after an n$^+$-type polycrystalline silicon film acting as the contact plug 60 has been formed on the entire surface in such a manner that the silicon film fills the second contact hole, the entire surface of the n$^+$-type polycrystalline silicon film is retreated by etch back or CMP techniques to form the contact plug 60 in the second contact hole in such a manner that the plug is embedded in the contact hole (FIG. 13B).

Figure 13C:
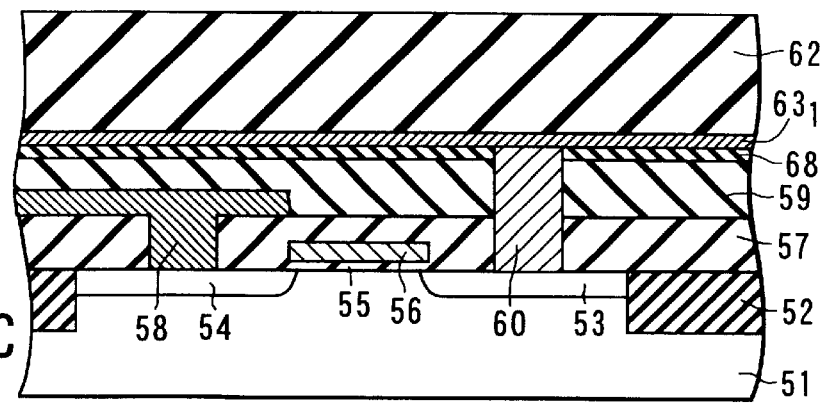

Next, after a thin first Ru film 63$_1$ has been formed by spattering techniques on the entire surface, an SiO$_2$ film 62 is formed on the first Ru film 63$_1$ (FIG. 13C).

Figure 13D:
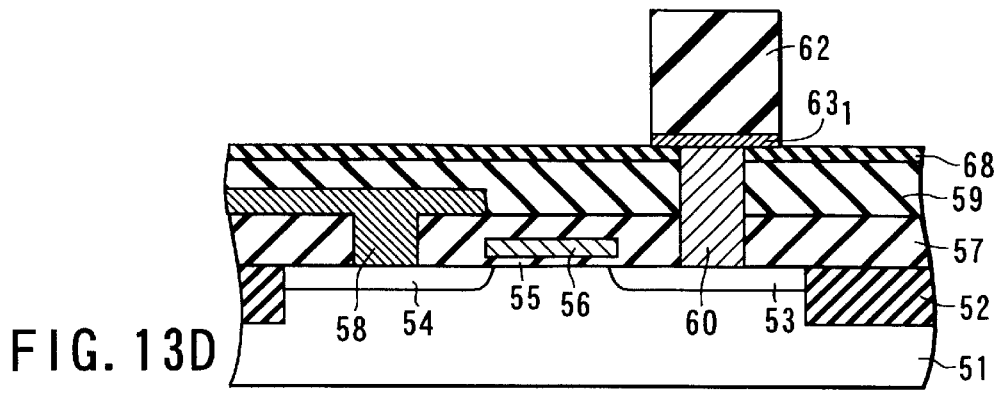

Then, using photolithography and RIE, the first Ru film 63$_1$ and SiO$_2$ film 62 are processed into cylindrical shape (FIG. 13D).

Figure 13E:
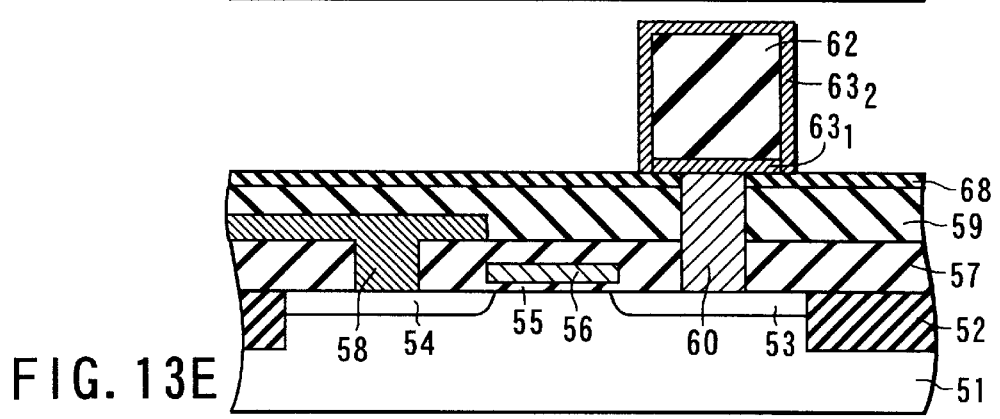

Next, a thin second Ru film 63$_2$ is selectively formed on the surfaces of the first Ru film 63$_1$ and SiO$_2$ film 62 by CVD techniques (FIG. 13E).

Specifically, for example, the substrate temperature is set in the range from 150° C. to 290° C. and the film formation pressure is set in the range from 1 Pa to 10 Pa. Ar gas is used as carrier gas. Ru(C$_2$H$_5$C$_5$H$_4$)$_2$ (bisethylcyclopentadienylruthenium, hereinafter, abbreviated as Ru(EtCp)2) gas is. introduced into a film formation chamber. Furthermore, O$_2$ gas is introduced into the film formation chamber so that the concentration of O$_2$ in an atmosphere may be 40% or less. Under these conditions, the second Ru film 63$_2$ is formed.

Figure 13F:
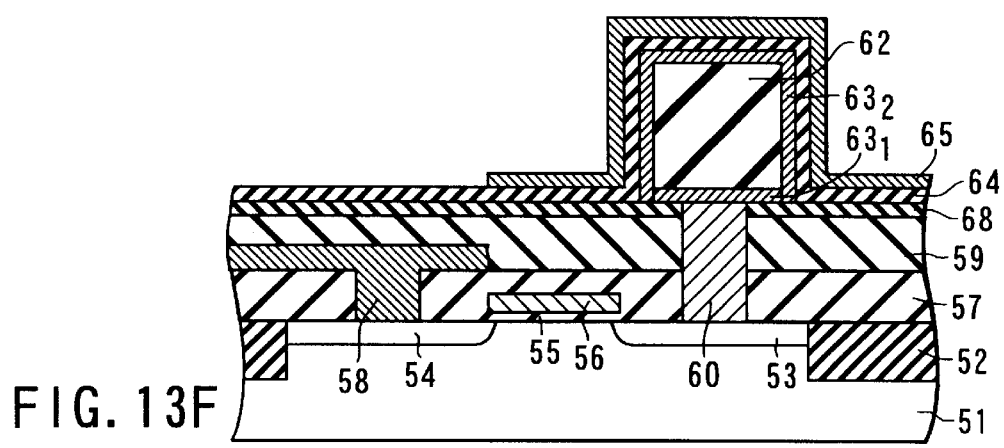

Then, a (Ba, Sr)TiO$_3$ film 64, a high-permittivity insulating film, is formed as a capacitor insulating film on the entire surface (FIG. 13F).

Finally, a thin Ru film 65 acting as an upper capacitor electrode is formed on the (Ba, Sr)TiO$_3$ film 64 by CVD techniques (FIG. 13F).

Specifically, for example, the substrate temperature is set at 350° C. and the film formation pressure is set at 50 Pa. After a thin Ru film 65 has been formed by CVD techniques using Ru(EtCp)$_2$ gas (carrier gas: Ar gas) and O$_2$ gas, the Ru film 65 is processed by photolithography and RIE to form a thin Ru film 65 acting as the upper capacitor electrode.

Because in the fifth embodiment, the entire surface of the SiO$_2$ film 62 covered with the thin Ru films 63$_1$, 63$_2$ is used as the lower capacitor electrode, the fifth embodiment produces the same effect as the third embodiment.

(Sixth Embodiment)

Figure 14:
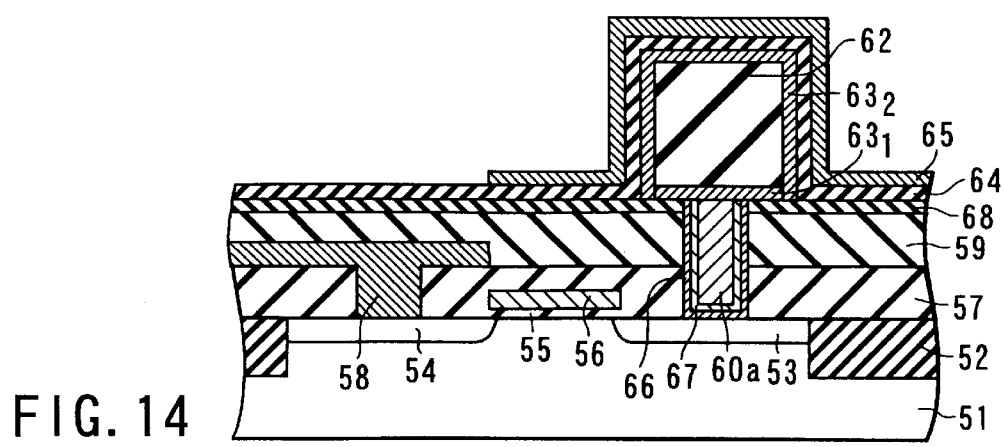
FIG. 14 is a sectional view of a DRAM memory cell according to a sixth embodiment of the present invention.

FIG. 14 is a sectional view of a DRAM memory cell according to a sixth embodiment of the present invention. The parts corresponding to those of the memory cell of the fifth embodiment in FIG. 12 are indicated by the same reference symbols and a detailed explanation of them will be omitted.

The sixth embodiment differs mainly from the fifth embodiment in that the second contact hole is filled with a contact plug 60a made of metal and in that a $Ru_2$ film $63_1$ acting as a lower capacitor electrode is formed by selective CVD techniques using $Ru(MeCp)_2$ gas (carrier gas: Ar gas) and $O_3$ gas. In the sixth embodiment, a tungsten film is used as the contact plug 60a.

On the inside face (the side and bottom faces) of the second contact hole, a stacked film (reaction prevention film) of a Ti film 66 and a TiN film 67 is formed to prevent the contact plug 60a from reacting with the $n^+$-type drain diffused layer 53.

FIGS. 15A to 15E are sectional views showing step by step a method of forming a memory cell of the sixth embodiment.

Figure 15A:
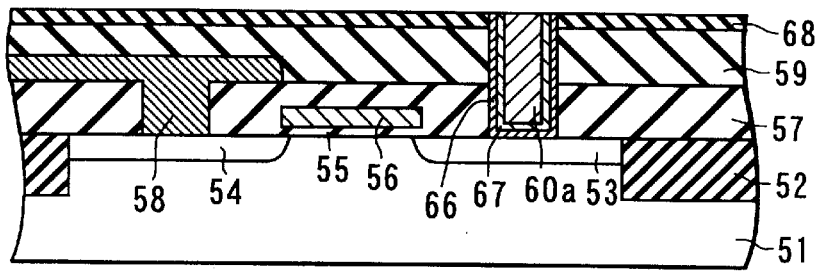
FIGS. 15A to 15E are sectional views showing step by step a method of forming memory cells of the sixth embodiment.

After the process shown in FIG. 13A of the fifth embodiment, tungsten films acting as the Ti film 66, TiN film 67, and contact plug film 60a are formed in that order on the entire surface in such a manner that they fill the second contact hole as shown in FIG. 15A. Thereafter, the second interlayer insulating film 59 and the extra Ti film 66, TiN film 67, and tungsten film on the second contact hole are removed by etch back or CMP techniques. In this way, the contact plug 60a is formed in the second contact hole via the Ti film 66 and TiN film 67 in such a manner that the plug film 60a is embedded in the contact hole.

Figure 15B:
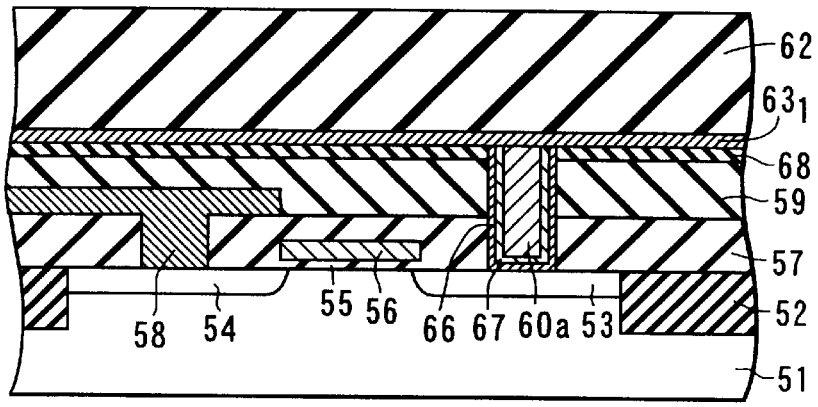

Next, after a thin first Ru film $63_1$ has been formed by spattering techniques on the entire surface, an $SiO_2$ film 62 is formed on the first Ru film $63_1$ (FIG. 15B).

Figure 15C:
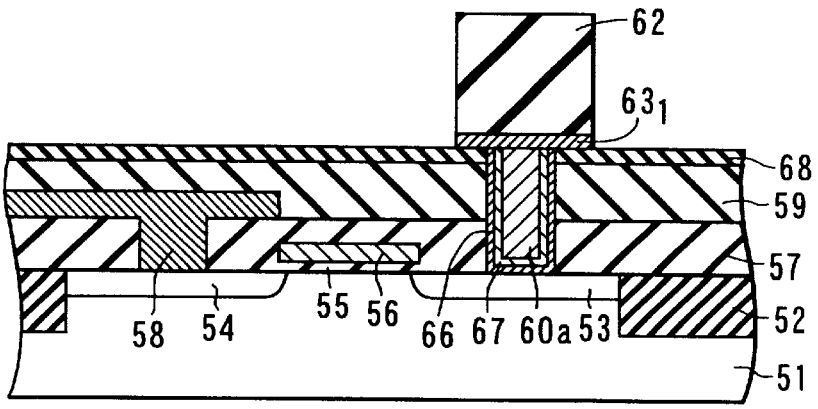

Then, using photolithography and RIE, the first Ru film $63_1$ and $SiO_2$ film 62 are processed into cylindrical shape (FIG. 15C).

Figure 15D:
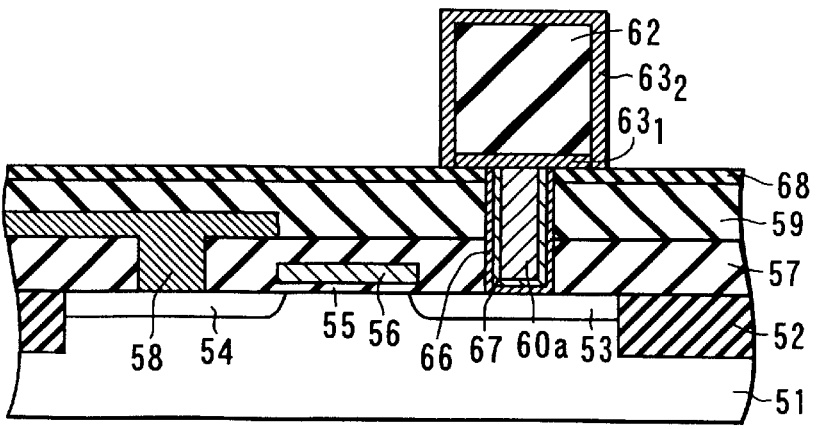

Next, a thin second Ru film $63_2$ is selectively formed on the surfaces of the first Ru film $63_1$ and $SiO_2$ film 62 by CVD techniques (FIG. 15D).

Specifically, for example, the substrate temperature is set in the range from 150° C. to 290° C. and the film formation pressure is set in the range from 1 Pa to 10 Pa. Ar gas is used as carrier gas. $Ru(MeCp)_2$ gas is introduced into a film formation chamber. Furthermore, $O_3$ gas is introduced into the film formation chamber so that the concentration of $O_3$ in an atmosphere may be 30% or less. Under these conditions, the second Ru film $63_2$ is selectively formed.

Figure 15E:
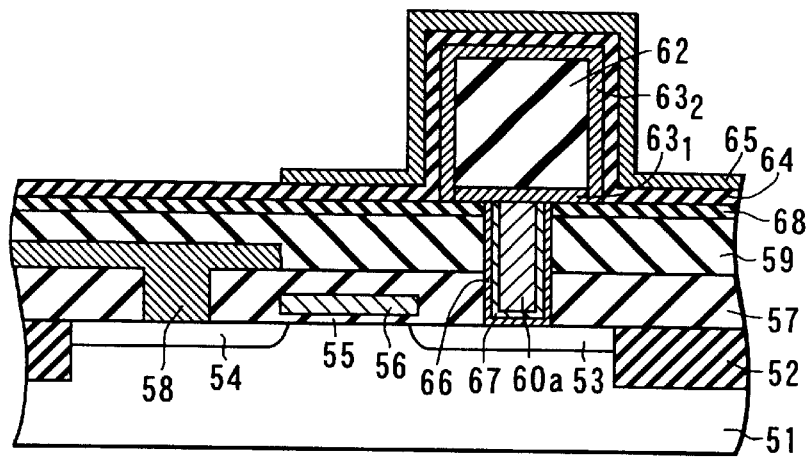

Then, a $(Ba, Sr)TiO_3$ film 64, a high-permittivity insulating film, is formed as a capacitor insulating film on the entire surface (FIG. 15E).

Finally, a thin Ru film 65 acting as an upper capacitor electrode is formed on the $(Ba, Sr)TiO_3$ film 64 by CVD techniques (FIG. 15E).

Specifically, for example, the substrate temperature is set at 350° C. and the film formation pressure is set at 50 Pa. A thin Ru film 65 is formed by CVD techniques using $Ru(MeCp)_2$ gas (carrier gas: Ar gas) and $O_2$ gas. Thereafter, the Ru film 65 is processed by photolithography and RIE to form a thin Ru film 65 acting as the upper capacitor electrode.

In the sixth embodiment, the entire surface of the $SiO_2$ film 62 covered with the thin Ru films $63_1$, $63_2$ is used as the lower capacitor electrode. Therefore, the sixth embodiment produces the same effect as the fifth embodiment.

(Seventh Embodiment)

Figure 16:
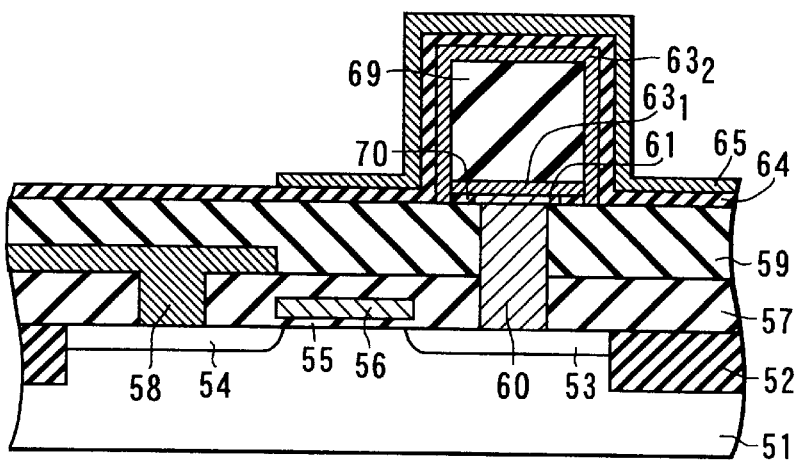
FIG. 16 is a sectional view of a DRAM memory cell according to a seventh embodiment of the present invention.

FIG. 16 is a sectional view of a DRAM memory cell according to a seventh embodiment of the present invention.

The seventh embodiment differs from the third embodiment in that a silicon nitride film 69 is used as an insulating film constituting a lower capacitor electrode and in that a silicon oxide film 70 is formed under the periphery of the silicon nitride film 69 and under a second Ru film $63_2$ outside the periphery and an $n^+$-type polycrystalline silicon 61 is prevented from coming in direct contact with a $(Ba, Sr)TiO_3$ film 64.

FIGS. 17A to 17F are sectional views showing step by step a method of forming a memory cell of the seventh embodiment.

Figure 17A:
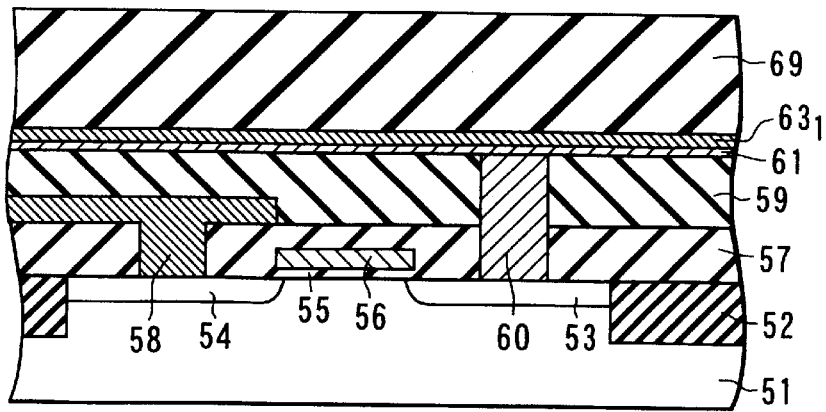
FIGS. 17A to 17F are sectional views showing step by step a method of forming memory cells of the seventh embodiment.

After the process shown in FIG. 9B of the third embodiment, an $n^+$-type polycrystalline silicon film 61 is formed on the entire surface as shown in FIG. 17A. Then, after a thin first Ru film $63_1$ containing a trace amount of oxygen have been formed by spattering techniques on the $n^+$-type polycrystalline silicon film 61, a silicon nitride film 69 is formed on the first Ru film $63_1$.

Figure 17B:
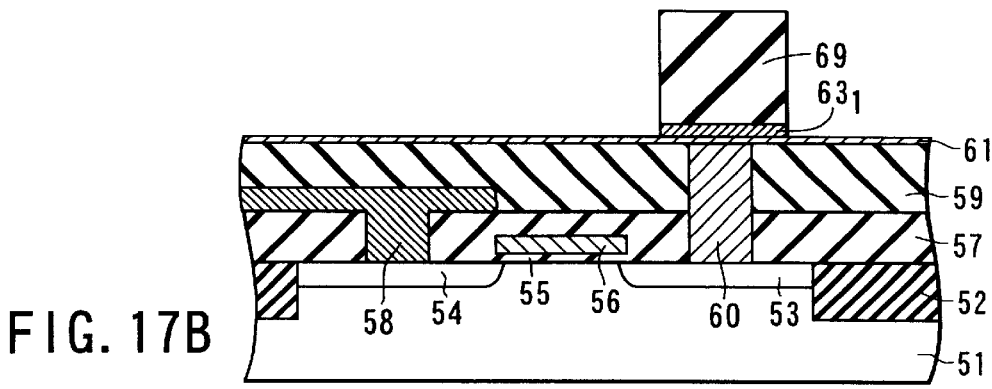

Then, using photolithography and RIE, the first Ru film $63_1$ and silicon nitride film 69 are processed into cylindrical shape. These first Ru film $63_1$ and silicon nitride film 69 are present on the contact plug 60a (FIG. 17B).

Figure 17C:
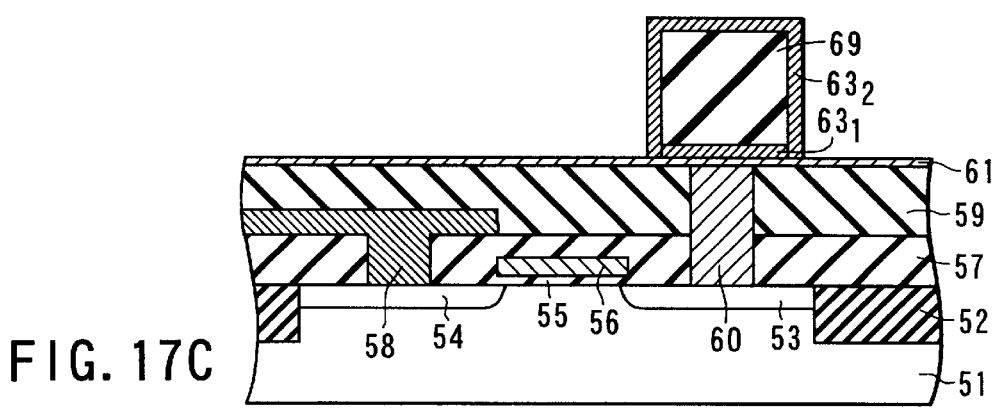

Next, a thin second Ru film $63_2$ is selectively formed on the surfaces of the first Ru film $63_1$ and silicon nitride film 69 by CVD techniques (FIG. 17C).

Specifically, for example, the substrate temperature is set in the range from 200° C. to 450° C. and the film formation pressure is set in the range from 10 Pa to 100 Pa. Ar gas is used as carrier gas. $Ru(Cp)_2$ gas is introduced into a film formation chamber. Furthermore, $O_2$ gas is introduced into the film formation chamber so that the concentration of $O_2$ in an atmosphere may be 40% or less. Under these conditions, the second Ru film $63_2$ is selectively formed.

Figure 17D:
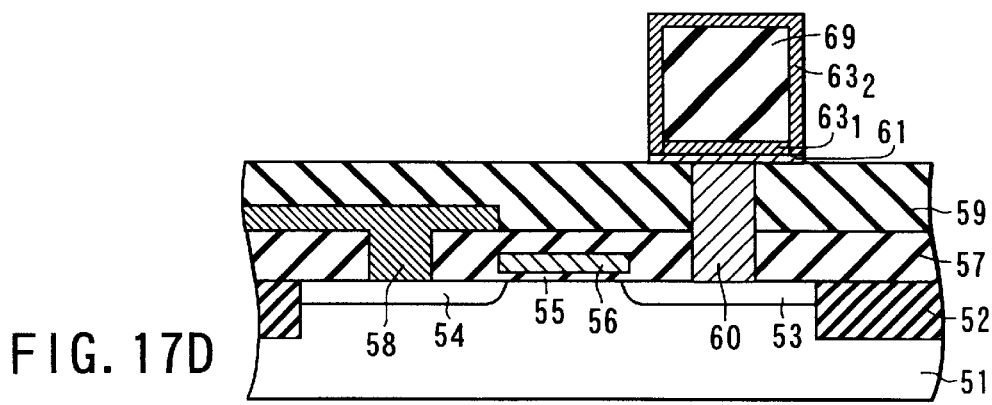

Next, as shown in FIG. 17D, the exposed $n^+$-type polycrystalline silicon film 61 is selectively etched away by RIE techniques (FIG. 17D).

Figure 17E:
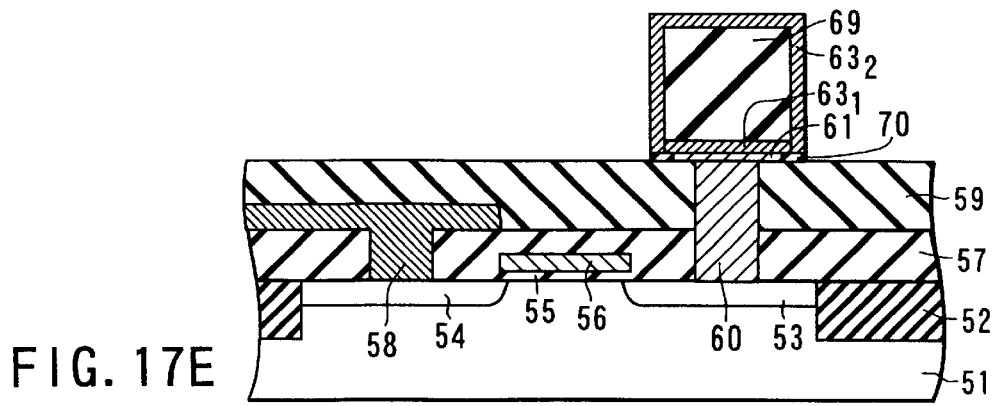

Then, the periphery of the $n^+$-type polycrystalline silicon film 61 is selectively oxidized and a silicon oxide film ($SiO_2$ film) 70 is selectively formed under the periphery of the silicon nitride film 69 and under the second Ru film $63_2$ outside the periphery (FIG. 17E).

Specifically, for example, the periphery of the $n^+$-type polycrystalline silicon film 61 is selectively oxidized by thermal processing in the temperature range from 500° C. to 800° C. in an atmosphere of a mixed gas of $N_2$ gas, $H_2$ gas, and $H_2O$ gas. As a result, the $n^+$-type polycrystalline silicon film 61 is isolated from the $(Ba, Sr)TiO_3$ film 64 by the silicon oxide film 70.

When selective oxidation is not used, the surface of the second Ru film $63_2$ is also be oxidized and $RuO_2$ is formed on its surface. Because $RuO_2$ is conductive, there is no problem in terms of conductivity.

When the surface of the second Ru film $63_2$ is oxidized extremely, however, the volume expansion can degrade the morphology of the surface of the second Ru film $63_2$ and even the characteristic of the capacitor. Therefore, it is desirable that the silicon oxide film 70 should be formed by selective oxidation. Of course, when the surface of the morphology of the surface of the second Ru film $63_2$ is not degraded, techniques other than selective oxidation may be used.

Figure 17F:
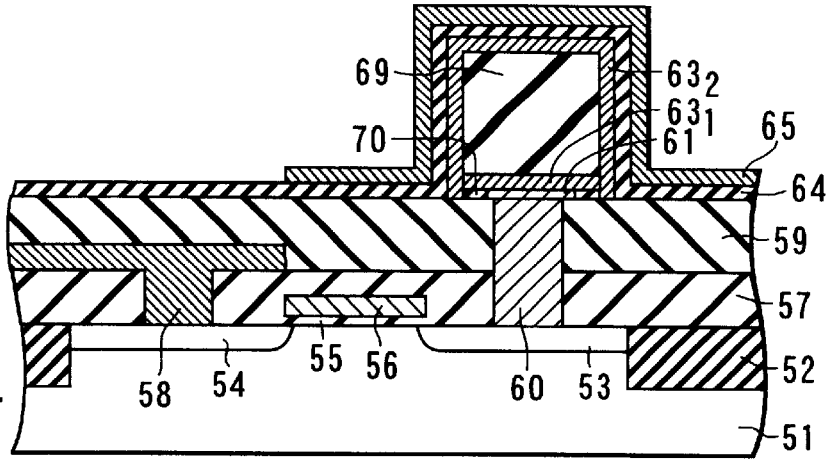

Then, a $(Ba, Sr)TiO_3$ film 64, a high-permittivity insulating film, is formed as a capacitor insulating film on the entire surface (FIG. 17F).

Finally, a thin Ru film 65 acting as an upper capacitor electrode is formed on the $(Ba, Sr)TiO_3$ film 64 by CVD techniques (FIG. 17F).

Specifically, for example, the substrate temperature is set at 350° C. and the film formation pressure is set at 50 Pa. After a thin Ru film 65 has been formed by CVD techniques using Ru(Cp)$_2$ gas (carrier gas: Ar gas) and O$_2$ gas, the Ru film 65 is processed by photolithography and RIE to form a thin Ru film 65 acting as the upper capacitor electrode.

Figure 18:
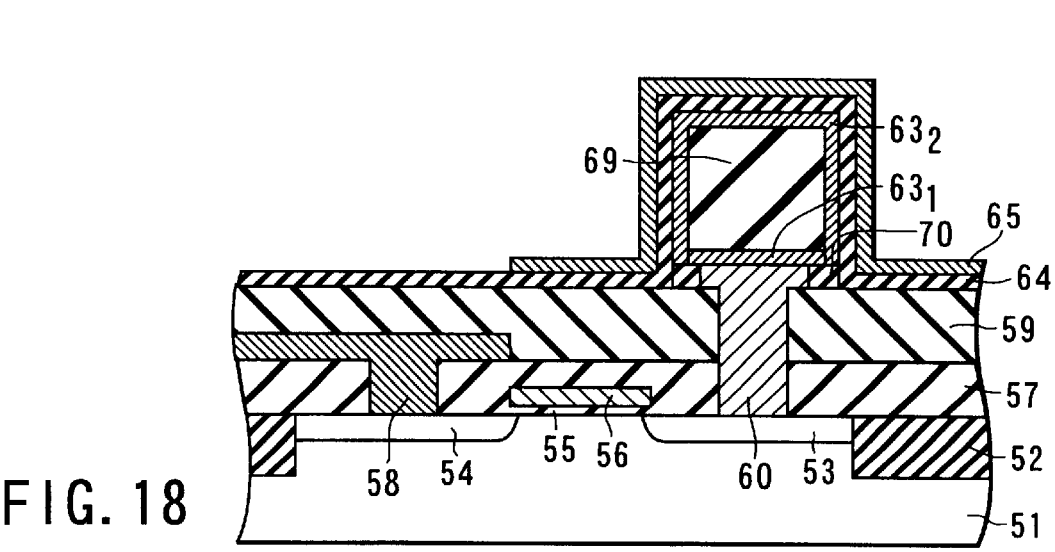
FIG. 18 is a sectional view of a modification of the seventh embodiment.

In the seventh embodiment, after the n$^+$-type polycrystalline silicon film (contact plug) 60 has been formed in the second contact hole in such a manner that the film 60 is embedded in the second contact hole, the n$^+$-type polycrystalline silicon film 61 is formed in the process of FIG. 17A. As shown FIG. 18, however, the n$^+$-type polycrystalline silicon film 60 may be substituted for the n$^+$-type polycrystalline silicon film 61.

In this case, after the n$^+$-type polycrystalline silicon film 60 has been formed on the entire surface in such a manner that the silicon film 60 fills the second contact hole in the process of forming the n$^+$-type polycrystalline silicon film (contact plug) 60, the surface of the n$^+$-type polycrystalline silicon film 60 is flattened.

In the seventh embodiment, the entire surface of the SiO$_2$ film 62 covered with the thin Ru films 63$_1$, 63$_2$ is used as the lower capacitor electrode. Therefore, the seventh embodiment produces the same effect as the third embodiment.

Furthermore, with the seventh embodiment, because the n$^+$-type polycrystalline silicon film 61 is isolated from the (Ba, Sr)TiO$_3$ film 64 by the silicon oxide film 70 in the process of selective oxidation of FIG. 17E, this prevents the deterioration of the characteristic of the capacitor due to mutual diffusion between the n$^+$-type polycrystalline silicon film 61 and (Ba, Sr)TiO$_3$ film 64.

The selective oxidation is effective in the third embodiment which uses the lower capacitor electrode where the entire surface of the SiO$_2$ film 62 is covered with the Ru films 63$_1$, 63$_2$.

(Eighth Embodiment)

Figure 19:
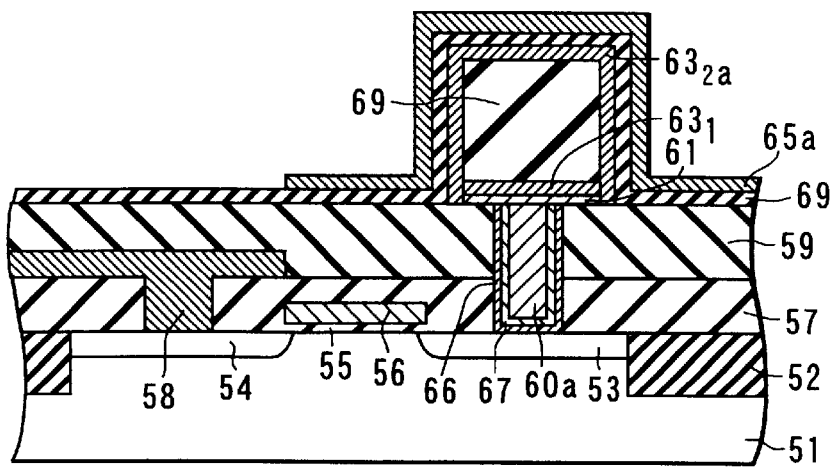
FIG. 19 is a sectional view of a DRAM memory cell according to an eighth embodiment of the present invention.

FIG. 19 is a sectional view of a DRAM memory cell according to an eighth embodiment of the present invention.

The eighth embodiment differs mainly from the fourth embodiment in that a silicon nitride film 69 and an Ru film 63$_1$ are used respectively as an insulating film constituting a lower capacitor electrode and a conductive film covering the undersurface of the insulating film and in that an RuO$_2$ film 63$_{2a}$ is formed by selective CVD techniques using Ru(Cp)$_2$ gas (carrier gas: Ar gas) and oxygen radical gas.

FIGS. 20A to 20E are sectional views showing step by step a method of forming a memory cell of the eighth embodiment.

After the process shown in FIG. 11A of the fourth embodiment, an n$^+$-type polycrystalline silicon film 61 is formed on the entire surface. Then, after a thin Ru film 63$_1$ containing a trace amount of oxygen has been formed by spattering techniques on the n$^+$-type polycrystalline silicon film 61, a silicon nitride film 69 is formed on the Ru film 63$_1$.

Figure 20A:
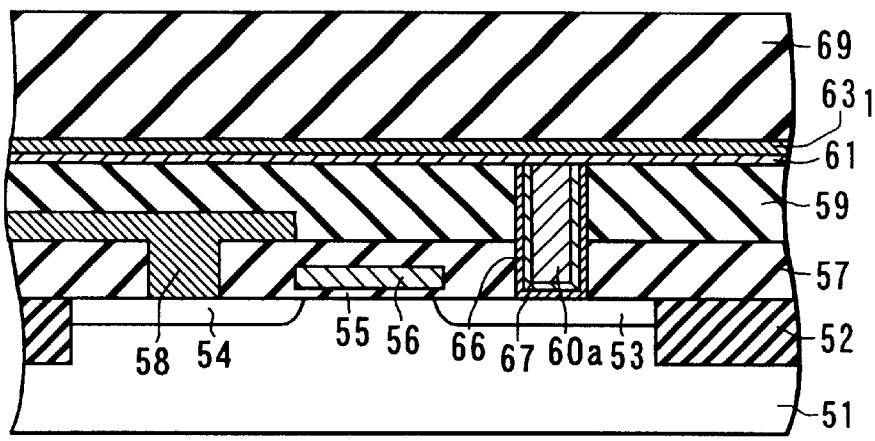
FIGS. 20A to 20E are sectional views showing step by step a method of forming memory cells of the eighth embodiment.
Figure 20B:
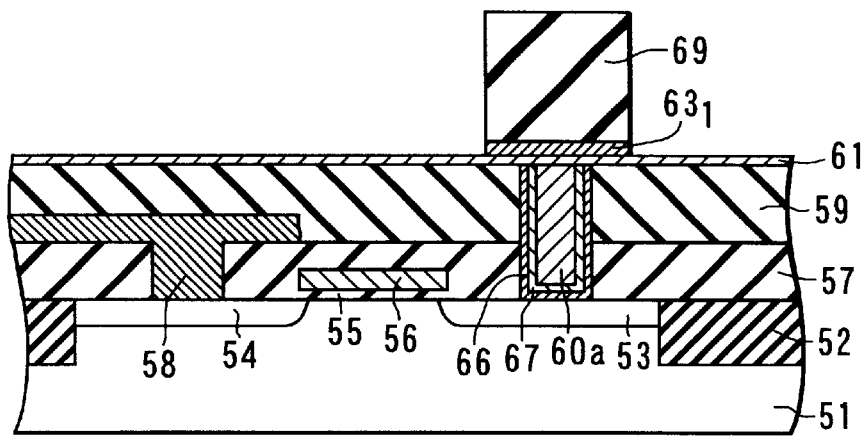

Then, using photolithography and RIE, the Ru film 63$_1$ and silicon nitride film 69 are processed into cylindrical shape. These Ru film 63$_1$ and silicon nitride film 69 are present on the contact plug 10a (FIG. 20B).

Figure 20C:
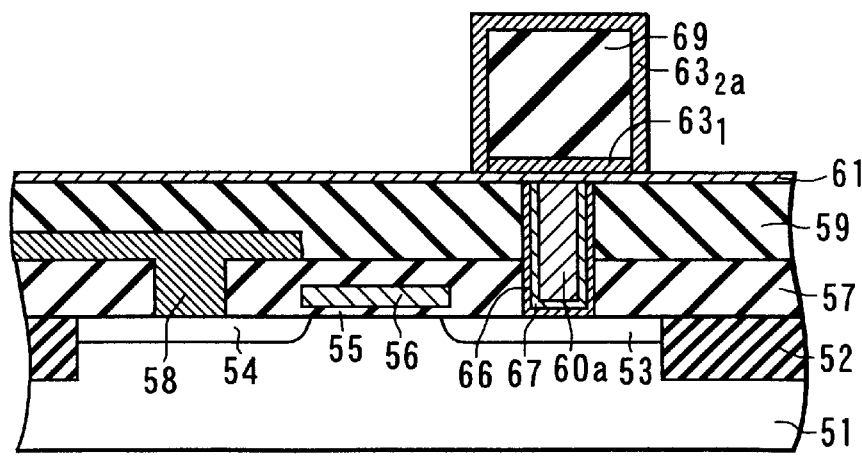

Next, a thin RuO$_2$ film 63$_{2a}$ is selectively formed on the surfaces of the Ru film 63$_1$ and silicon nitride film 69 by CVD techniques (FIG. 20C).

Specifically, for example, the substrate temperature is set in the range from 200° C. to 450° C. and the film formation pressure is set in the range from 10 Pa to 100 Pa. Ar gas is used as carrier gas. Ru(Cp)$_2$ gas is introduced into a film formation chamber. Furthermore, oxygen radical gas is introduced into the film formation chamber so that the concentration of oxygen radical gas in an atmosphere may be 40% or more. Under these conditions, the Ru film 63$_{2a}$ is formed.

Figure 20D:
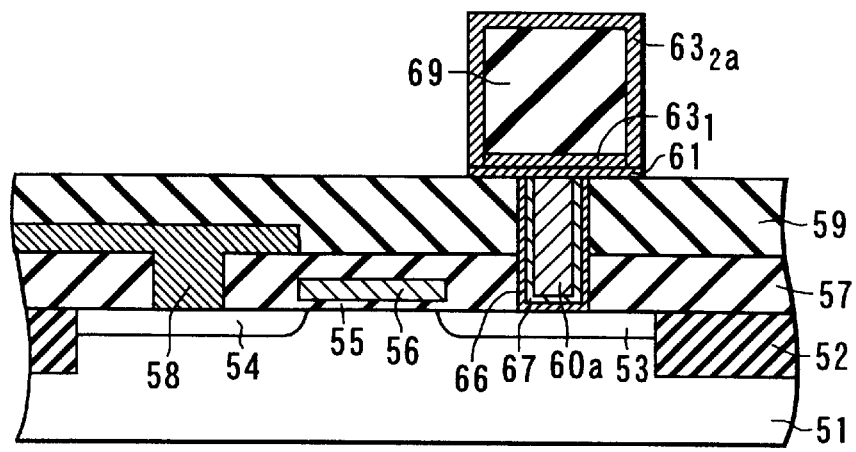

Next, the exposed n$^+$-type polycrystalline silicon film 61 is selectively etched away by RIE techniques (FIG. 20D).

Figure 20E:
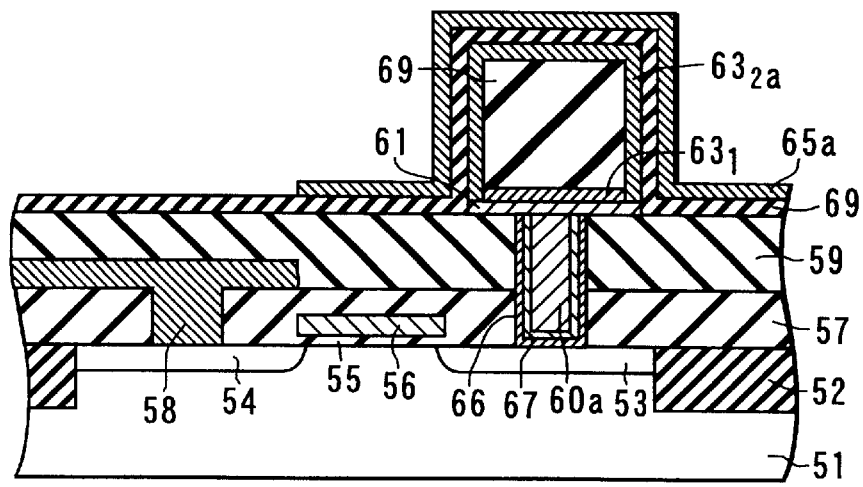

Then, a (Ba, Sr)TiO$_3$ film 64, a high-permittivity film, is formed as a capacitor insulating film on the entire surface (FIG. 20E).

Finally, a thin RuO$_2$ film 65$_a$ acting as an upper capacitor electrode is formed on the (Ba, Sr)TiO$_3$ film 64 by CVD techniques (FIG. 20E).

Specifically, for example, the substrate temperature is set at 350° C. and the film formation pressure is set at 50 Pa. After a thin RuO$_2$ film has been formed on the entire surface by CVD techniques using Ru(Cp)$_2$ gas (carrier gas: Ar gas) and O$_2$ gas, the RuO$_2$ film is processed by photolithography and RIE to form a thin RuO$_2$ film 65$_a$ acting as the upper capacitor electrode.

While in the eighth embodiment, oxygen radical gas has been used as oxidizing gas in selectively forming the Ru film 63$_{2a}$, oxygen radical gas may be used in selective formation of an Ru film. In this case, the concentration of oxygen radical in an atmosphere is set at less than 40%.

In the eighth embodiment, the entire surface of the SiO$_2$ film 62 covered with the thin Ru film 63$_1$ and RuO$_2$ film 63$_{2a}$ is used as the lower capacitor electrode. Therefore, the eighth embodiment produces the same effect as the fourth embodiment.

(Ninth Embodiment)

Figure 21:
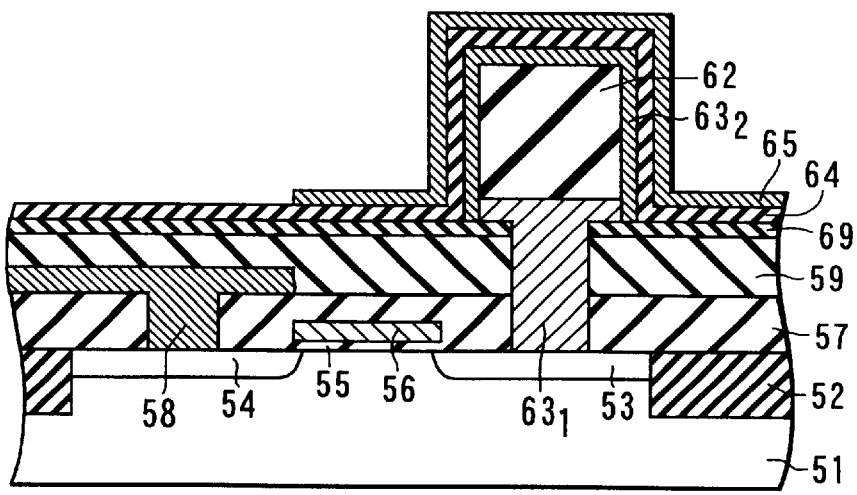
FIG. 21 is a sectional view of a DRAM memory cell according to a ninth embodiment of the present invention.

FIG. 21 is a sectional view of a DRAM memory cell according to a ninth embodiment of the present invention.

The ninth embodiment differs from the fifth embodiment in that a contact plug is formed from an Ru film. The Ru film and a first Ru film 63$_1$ are made of the same Ru film. With this structure, the contact plug and first Ru film 63$_1$ are formed simultaneously, helping reduce the number of processes.

FIGS. 22A to 22D are sectional views showing step by step a method of forming a memory cell of the ninth embodiment.

Figure 22A:
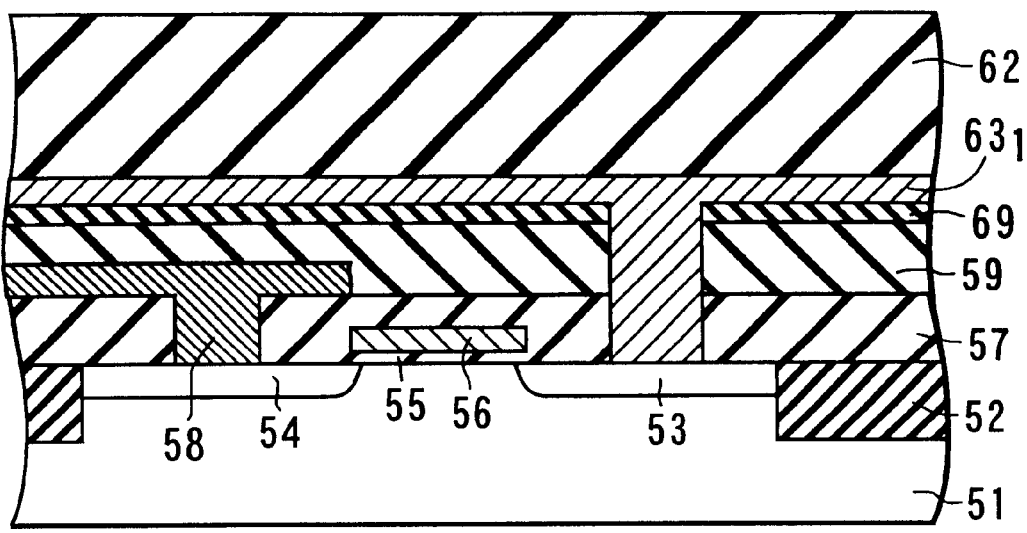
FIGS. 22A to 22D are sectional views showing step by step a method of forming memory cells of the ninth embodiment.

After the process in FIG. 13A in the fifth embodiment, a first Ru film 63$_1$ also serving as a contact plug is formed on the entire surface by CVD techniques in such a manner that the film 63$_1$ fills the second contact hole as shown in FIG. 22A.

Specifically, for example, the substrate temperature is set in the range from 400° C. to 470° C. and the film formation pressure is set at 50 Pa. Ru(EtCp)$_2$ gas (carrier gas: Ar gas) and O$_2$ gas are introduced into a film formation chamber, in which a first Ru film 63$_1$ is formed.

Figure 22B:
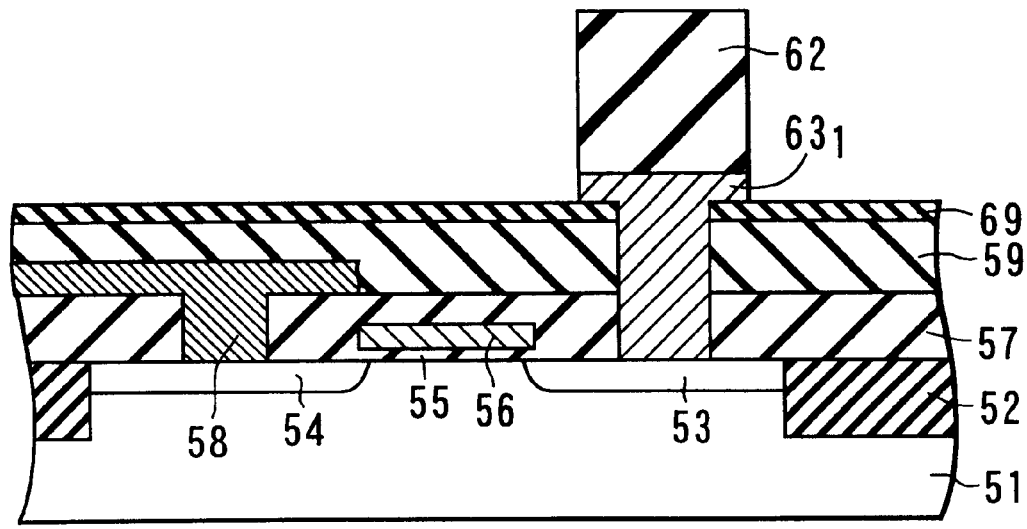

Then, using photolithography and RIE, the first Ru film 63$_1$ and SiO$_2$ film 62 outside the second contact hole are processed into cylindrical shape. These first Ru film 63$_1$ and SiO$_2$ film 62 are present in the second contact hole and on the periphery of the second contact hole (FIG. 22B).

Figure 22C:
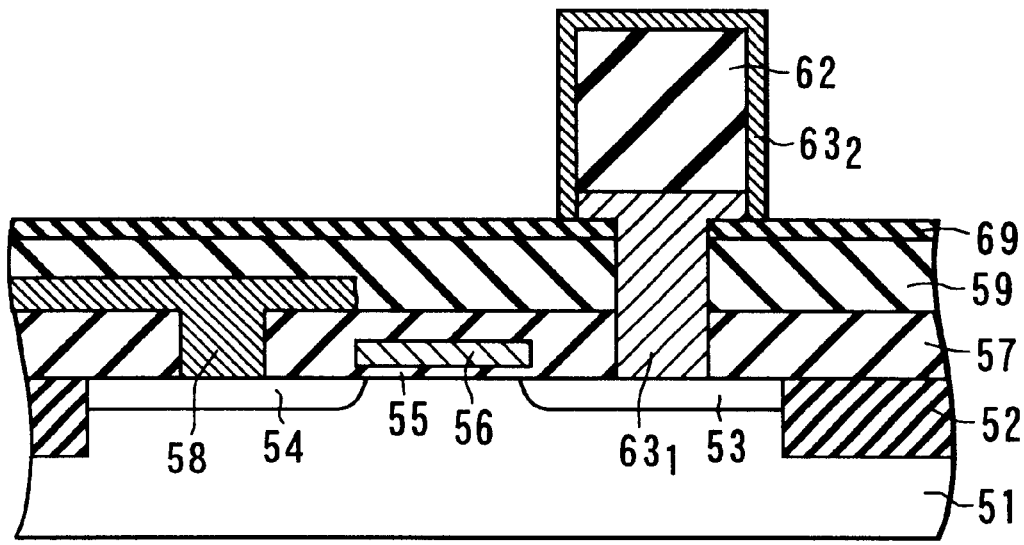

Next, a thin second Ru film 63$_2$ is selectively formed on the surfaces of the first Ru film 63$_1$ and SiO$_2$ film 62 by CVD techniques (FIG. 22C).

Specifically, for example, the substrate temperature is set in the range from 150° C. to 290° C. and the film formation pressure is set in the range from 1 Pa to 10 Pa. Ar gas is used as carrier gas. Ru(EtCp)$_2$ gas is introduced into a film formation chamber. Furthermore, $O_2$ gas is introduced into the film formation chamber so that the concentration of $O_2$ in an atmosphere may be 40% or less. Under these conditions, the second Ru film $63_2$ is formed.

Figure 22D:
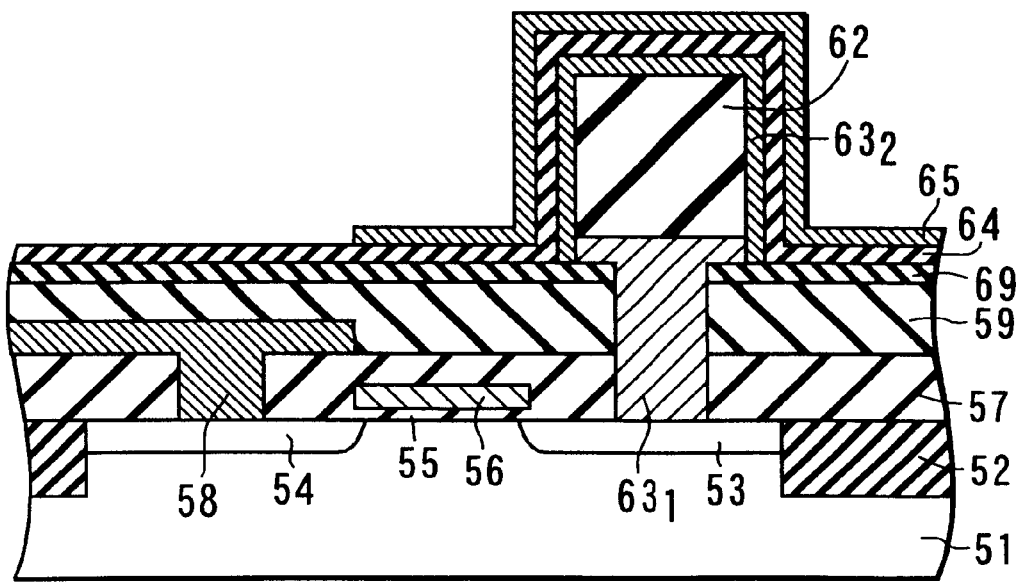

Then, a (Ba, Sr)$TiO_3$ film 64, a high-permittivity insulating film, is formed as a capacitor insulating film on the entire surface (FIG. 22D).

Finally, a thin Ru film 65 acting as an upper capacitor electrode is formed on the (Ba, Sr)$TiO_3$ film 64 by CVD techniques (FIG. 22D).

Specifically, for example, the substrate temperature is set at 350° C. and the film formation pressure is set at 50 Pa. After a thin Ru film has been formed by CVD techniques using $Ru(EtCp)_2$ gas (carrier gas: Ar gas) and $O_2$ gas, the Ru film is processed by photo-lithography and RIE to form a thin Ru film 65 acting as the upper capacitor electrode.

Even by CVD techniques using the same source material gases, that is, $Ru(Cp)_2$ gas (carrier cas: Ar gas) and $O_2$ gas, the suitable setting of the substrate temperature and film formation pressure as in the embodiments enables the Ru films to be formed on the entire surface or to be selectively formed.

The first Ru film $63_1$ is formed on the $n^+$-type drain diffused layer 53. At the interface between the first Ru film $63_1$ and $n^+$-type drain diffused layer 53, a very thin amorphous layer (with a thickness of several nm) composed of Ru, Si, and O is formed. This prevents silicide from being formed even in thermal processing at 50° C. or higher and makes the contact resistance as low as $10-6\Omega\cdot cm^2$ or less.

Furthermore, it has become clear that the amorphous layer inhibited Ru atoms in the first Ru film $63_1$ from diffusing into the p-type silicon substrate 51, preventing a leakage current at the junctions from occurring.

The present invention is not limited to the above embodiments. For instance, while in the embodiments, a (Ba, Sr)$TiO_3$ film, a high-permittivity metal oxide dielectric film, has been used as the capacitor insulating film, other high-permittivity metal oxide dielectric films may be used. They include a high dielectric film made of $SrTiO_3$ and $TaO_5$ and a high dielectric film made of $BaTiO_3$, $PbTiO_3$, $Bi_4Ti_3O_{12}$, $SrBi_2TaOg$, Pb(Z, Ti)$O_3$, and (Pb, La)(Zr, Ti)$O_3$.

While in the embodiments, the Ru films or $RuO_2$ films have been used as the upper capacitor electrode, an Ni film, a Pt film, an Ir film, an $IrO_2$ film, or an $SrRuO_3$ film may be used.

Furthermore, while in the embodiments, the $n^+$-type polycrystalline silicon film has been used as the silicon film containing impurities, a $p^+$-type polycrystalline silicon film, an epitaxial silicon film containing impurities, and an amorphous silicon film containing impurities may be used. That is, there is no particular limit to the conductivity type of impurities or the crystal state of the silicon films.

While in the above embodiments, the Ru films or $RuO_2$ films have been formed by CVD techniques using $Ru(Cp)_2$, $Ru(MeCp)_2$, $Ru(EtCp)_2$ as source material gas, other methallocene gases or their derivative gases may be used as source material gas.

While in the embodiments, the present invention have been applied to a capacitor in a DRAM memory cell, it may be applied to a capacitor in an FRAM memory cell. Moreover, the invention may be applied to electrodes other than capacitor electrodes.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first lower capacitor electrode formed of a first conductive film and having a top face and a side face, wherein said first conductive film is a Ta film;
   a second lower capacitor electrode formed of a second conductive film covering at least an upper portion of said side face of said first lower capacitor electrode, wherein said second conditive film is an Ru film;
   a capacitor insulating film provided on said second lower capacitor electrode; and
   an upper capacitor electrode provided on said capacitor insulating film, wherein
   film stress of said first conductive film is lower than that of said second conductive film and a volume of said first conductive film is larger than that of said second conductive film.

2. A semiconductor device according to claim 1, wherein said second conductive film forming said second lower capacitor electrode further covers said top face of said first conductive film.

3. A semiconductor device according to claim 1, wherein said capacitor insulating film is a high-permittivity insulating film.

4. A semiconductor device according to claim 1, wherein said capacitor insulating film is a high-permittivity dielectric film containing Ba, Sr, and Ti.

5. A semiconductor device according to claim 1, wherein a lower portion of said the side face of said first lower capacitor electrode is covered with an insulating film.

6. A semiconductor device according to claim 1, wherein said second lower capacitor electrode at an edge of said top face of said first lower capacitor electrode is rounded.

7. A semiconductor device according to claim 1, wherein said first and said second lower capacitor electrode forms a storage node of a capacitor in a stacked DRAM.

8. A semiconductor device comprising:
   a semiconductor substrate;
   an insulating member formed above said semiconductor substrate; and
   an electrode covering an entire surface of said insulating member, said electrode being composed of at least one conductive material of ruthenium, ruthenium oxide, and a compound of ruthenium and ruthenium oxide, and said electrode is closer to said semiconductor substrate of two capacitor electrodes constituting a capacitor.

9. A semiconductor device according to claim 8, wherein said insulating member contains anyone of silicon oxide and silicon nitride.

10. A semiconductor device according to claim 8, further comprising:
    an interlayer insulating film formed between said electrode and said semiconductor substrate;
    a contact plug formed so as to penetrate said interlayer insulating film and connecting said electrode to a conductive region formed on said semiconductor substrate; and
    a conductive film made of a material different from a constituent material of said electrode and provided between said electrode and said contact plug.

11. A semiconductor device according to claim 10, wherein said conductive film is a silicon film containing impurities.

12. A semiconductor device according to claim 11, wherein said conductive film is surrounded by a silicon oxide film formed between a peripheral portion of said electrode and said interlayer insulating film.

13. A semiconductor device according to claim 10, wherein at least a surface portion of said interlayer insulating film is made of a silicon nitride film.

* * * * *